United States Patent
Van Horn et al.

(10) Patent No.: US 7,208,959 B2
(45) Date of Patent: Apr. 24, 2007

(54) METHODS FOR MEASURING PARASITIC CAPACITANCE AND INDUCTANCE OF I/O LEADS ON AN ELECTRICAL COMPONENT USING A NETWORK ANALYZER

(75) Inventors: Mark T. Van Horn, Boise, ID (US); Richard N. Hedden, Kuna, ID (US); David R. Cuthbert, Meridian, ID (US); Aaron M. Schoenfeld, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/269,047

(22) Filed: Nov. 7, 2005

(65) Prior Publication Data

US 2006/0043987 A1 Mar. 2, 2006

Related U.S. Application Data

(62) Division of application No. 10/873,692, filed on Jun. 22, 2004, which is a division of application No. 10/367,490, filed on Feb. 13, 2003, which is a division of application No. 09/650,798, filed on Aug. 30, 2000, now Pat. No. 6,563,299.

(51) Int. Cl.
*G01R 27/06* (2006.01)
*G01R 31/02* (2006.01)
*G01R 31/11* (2006.01)

(52) U.S. Cl. ............... 324/642; 324/534; 324/765; 324/754

(58) Field of Classification Search ............ 324/534, 324/533, 527, 642, 646, 628, 690

See application file for complete search history.

(56) References Cited

U.S. PATENT DOCUMENTS

| | | | |
|---|---|---|---|
| 3,685,002 A | | 8/1972 | Kennedy |
| 3,983,623 A | | 10/1976 | Wellington |
| 4,712,062 A | | 12/1987 | Takamine |
| 4,912,401 A | | 3/1990 | Nady et al. |
| 4,972,413 A | | 11/1990 | Littlebury et al. |
| 5,003,253 A | | 3/1991 | Majidi-Ahy et al. |
| 5,144,228 A | | 9/1992 | Sorna et al. |
| 5,160,893 A | * | 11/1992 | Lamson ............ 324/654 |
| 5,198,754 A | | 3/1993 | Binet |
| 5,307,284 A | | 4/1994 | Brunfeldt et al. |
| 5,475,569 A | | 12/1995 | Jain et al. |
| 5,666,003 A | | 9/1997 | Shibata et al. |
| 5,703,396 A | | 12/1997 | Kurihara |
| 5,773,985 A | | 6/1998 | Bradley |
| 5,831,870 A | | 11/1998 | Folta et al. |
| 5,901,305 A | | 5/1999 | Futagami |
| 5,920,117 A | | 7/1999 | Sono et al. |

(Continued)

*Primary Examiner*—Anjan Deb
(74) *Attorney, Agent, or Firm*—TraskBritt

(57) ABSTRACT

Methods are provided for measuring the potential for mutual coupling in an integrated circuit package of any type or configuration using a network analyzer in conjunction with a coaxial test probe. Simple, low-cost test fixturing and methods of testing may be used to measure the parasitic capacitance and inductance of one or more I/O leads of an integrated circuit package, the measured parasitic capacitances and inductances providing an indication of the susceptibility of the integrated circuit package to mutual coupling between electrical leads of the package or between an electrical lead and other components of the integrated circuit package.

18 Claims, 8 Drawing Sheets

U.S. PATENT DOCUMENTS

| | | |
|---|---|---|
| 5,963,043 A | 10/1999 | Nassif |
| 5,968,191 A | 10/1999 | Thatcher et al. |
| 5,999,010 A | 12/1999 | Arora et al. |
| 6,084,297 A | 7/2000 | Brooks et al. |
| 6,107,684 A | 8/2000 | Busking et al. |
| 6,114,751 A * | 9/2000 | Kumakura et al. ......... 257/666 |
| 6,175,152 B1 | 1/2001 | Toyoda |
| 6,232,650 B1 | 5/2001 | Fujisawa et al. |
| 6,281,691 B1 | 8/2001 | Matsunaga et al. |
| 6,300,765 B1 | 10/2001 | Chen |
| 6,348,809 B1 | 2/2002 | Hirota et al. |
| 6,384,618 B1 | 5/2002 | Pursel et al. |
| 6,400,168 B2 * | 6/2002 | Matsunaga et al. ......... 324/754 |
| 6,404,222 B1 | 6/2002 | Fan et al. |
| 6,472,886 B2 | 10/2002 | Lee |
| 6,476,486 B1 | 11/2002 | Humphrey et al. |
| 6,477,046 B1 | 11/2002 | Stearns et al. |
| 6,479,758 B1 | 11/2002 | Arima et al. |
| 6,501,283 B2 | 12/2002 | Lindolf et al. |
| 6,563,299 B1 | 5/2003 | Van Horn |
| 6,621,155 B1 * | 9/2003 | Perino et al. ............... 257/686 |
| 6,646,338 B2 | 11/2003 | Hashimoto |
| 6,657,425 B2 | 12/2003 | Sowlati et al. |
| 6,707,151 B2 | 3/2004 | Noguchi |
| 6,707,153 B2 | 3/2004 | Kuwabara et al. |
| 6,756,792 B2 | 6/2004 | Armbruster |
| 6,798,212 B2 * | 9/2004 | Stierman et al. ........... 324/534 |
| 6,870,375 B2 | 3/2005 | Sarma et al. |
| 6,934,669 B1 | 8/2005 | Suaya et al. |
| 2005/0127923 A1 | 6/2005 | Wu et al. |
| 2005/0161801 A1 | 7/2005 | Van Horn et al. |

* cited by examiner

METHODS FOR MEASURING PARASITIC CAPACITANCE AND INDUCTANCE OF I/O LEADS ON AN ELECTRICAL COMPONENT USING A NETWORK ANALYZER

CROSS-REFERENCE TO RELATED APPLICATIONS

This application is a divisional of application Ser. No. 10/873,692, filed Jun. 22, 2004, pending, which is a divisional of application Ser. No. 10/367,490, filed Feb. 13, 2003, pending, which is a divisional of application Ser. No. 09/650,798, filed Aug. 30, 2000, now U.S. Pat. No. 6,563,299, issued May 13, 2003.

BACKGROUND OF THE INVENTION

1. Field of the Invention

The present invention relates generally to the design and testing of integrated circuit devices. Specifically, the present invention relates to the electrical characterization of integrated circuit device packages at high operating frequencies and, in particular, to apparatus and methods for measuring parasitic capacitance and inductance of one or more I/O leads of an integrated circuit device package using a network analyzer.

2. State of the Art

Designers of integrated circuit devices are facing increasingly difficult challenges as a result of the current trend toward integrated circuit devices exhibiting small overall package dimensions and having a large number of leads, yet being capable of operating at high frequencies. Such an integrated circuit device may include a complex array of closely spaced electrical leads adapted for establishing electrical communication with a semiconductor die, each lead having one end electrically connected to the semiconductor die and an opposing end adapted for electrical connection to an external device, such as a printed circuit board. Presently, a wide variety of integrated circuit package types and configurations are commercially available, including, for example, Ball Grid Array (BGA) packages, Thin Small Outline Packages (TSOPs), as well as other package types. It is a continuing goal of integrated circuit package designers to adapt these package configurations to fit within ever-decreasing volumes, to include a large number of electrical leads, and to operate at high frequencies in order to meet the demand for such devices.

An exemplary embodiment of a conventional BGA package 100 is shown in FIGS. 1 and 2; The conventional BGA package 100 may be a memory device, such as a DRAM chip, a processor, or any other integrated circuit device known in the art. The conventional BGA package 100 includes a semiconductor die 110 secured to a die-attach pad 112 formed on an upper surface 106 of a substrate 105, which may also be termed an interposer. The BGA package 100 also includes a plurality of electrical leads 130 adapted to provide electrical communication between the semiconductor die 110 and one or more external devices (not shown). The semiconductor die 110 and at least a portion of each electrical lead 130 may be encased by an encapsulant material 120 or, alternatively, the conventional BGA package 100 may have no encapsulant material 120, depending upon the particular package construction and intended use.

Each of the electrical leads 130 includes an external ball lead 132 configured for electrical connection to an external device. The ball lead 132 may be secured to a conductive pad 133 formed on a lower surface 107 of the substrate 105. Each electrical lead 130 further comprises a conductive via 134 extending from the conductive pad 133 and through the substrate 105 to a conductive trace 136. The conductive trace 136 is formed on the upper surface 106 of the substrate 105 and provides an electrical path from the conductive via 134 to a bond end 137 located proximate the semiconductor die 110. A bond wire 138 attached to the bond end 137 of the conductive trace 136 and extending to the semiconductor die 110, where the bond wire 138 is attached to a bond pad thereon, electrically connects the electrical lead 130 to the semiconductor die 110. At least the bond wire 138 and conductive trace 136 of each electrical lead 130 may be encased by the encapsulant material 120.

The conventional BGA package 100 may include a plurality of the ball leads 132 arranged, for example, in an array or arrays of mutually adjacent rows and columns. Referring to FIG. 1, the ball leads 132 may be arranged in two arrays 150, 160, each array 150, 160 disposed between an edge of the semiconductor die 110 and a peripheral edge of the substrate 105. Each array 150, 160 comprises three columns 151, 152, 153, 161, 162, 163, respectively, of ball leads 132. The arrangement of ball leads 132 is typically referred to as the "pin-out" or the "footprint" of the BGA package 100. The pin-out of the BGA package 100 may, by way of example, comprise outer and inner columns 151, 161, 153, 163, respectively, of ball leads 132 adapted to provide input and output of electrical signals to and from the semiconductor die 110, such ball leads 132 being referred to herein as "I/O leads." The pin-out may further comprise center columns 152, 162 of ball leads 132 adapted to provide a power signal to the semiconductor die 110 (a "$V_{CC}$ lead"), to provide a ground potential for the semiconductor die 110 (a "$V_{SS}$ lead"), or to provide a reference voltage to the semiconductor die 110 (a "$V_{REF}$ lead"). However, those of ordinary skill in the art will understand that the particular pin-out of an integrated circuit device may vary depending upon the application and that the pin-out may be of any suitable configuration.

An exemplary embodiment of a conventional TSOP 200 is shown in FIGS. 3 and 4. The conventional TSOP 200 may be a memory device, such as a DRAM chip, a processor, or any other integrated circuit device known in the art. The conventional TSOP 200 includes a semiconductor die 210 secured to a die-attach pad 212. The TSOP 200 further includes a plurality of electrical leads 230 adapted to provide electrical communication between the semiconductor die 210 and one or more external devices (not shown). The semiconductor die 210 and at least a portion of each electrical lead 230 are encased by an encapsulant material 220.

Each of the electrical leads 230 includes an external portion 232 configured for electrical connection to an external device. Each electrical lead 230 also includes an internal portion 234 extending from the external portion 232 to a bond end 235 located proximate the semiconductor die 210. A transversely extending bus bar or bars 239 may extend between two or more electrical leads 230. A bond wire 238 electrically connects the bond end 235 of the internal portion 234 to a bond pad on the semiconductor die 210 to establish electrical communication therebetween. Bond wires 238 may also extend between the transverse bus bar or bars 239 and one or more bond pads on the semiconductor die 210. At least the internal portion 234 and bond wire 238 of each electrical lead 230 are encased by the encapsulant material 220.

The external portion 232 and internal portion 234 of each electrical lead 230 typically comprise a single piece of material commonly referred to as a lead finger. Further, the lead fingers (external and internal portions 232, 234), bus bar or bars 239, and die-attach pad 212 typically comprise a structure usually referred to as a lead frame. Integrated circuit packages utilizing lead frame construction are well known in the art. It will be appreciated by those of ordinary skill in the art that the conventional TSOP 200 may include a lead frame of any configuration known in the art and, further, that the internal portion 234 may extend over and directly attach to the semiconductor die 210, such a lead frame being commonly referred to as a Leads-Over-Chip (LOC) configuration.

The external portions 232 of the electrical leads 230 extend from one or more edges of the TSOP 200 and are arranged in a row therealong. For example, as shown in FIG. 3, the TSOP 200 may include a row 250 of electrical leads 230 extending from an edge of the TSOP 200 and another row 260 of electrical leads 230 extending from an opposing edge of the TSOP 200. The arrangement of the external portions 232 of the electrical leads 230 comprises the pin-out or footprint of the TSOP 200. An electrical lead 230 may be an I/O lead, a $V_{CC}$ lead, a $V_{SS}$ lead, or a $V_{REF}$ lead, as noted above, and the particular configuration of the pin-out will vary depending upon the application.

For both the conventional BGA package 100 and the conventional TSOP 200, as well as for other conventional integrated circuit package types, the spacing between the electrical leads 130, 230—especially between adjacent conductive traces 136 and between adjacent internal portions 234 thereof, respectively—is becoming increasingly smaller to accommodate smaller overall package sizes and greater numbers of electrical leads 130, 230, as was suggested above. This close spacing between adjacent electrical leads 130, 230 in the conventional BGA and TSOP packages 100, 200, respectively, in conjunction with increasingly higher operating frequencies for newer integrated circuit devices, may lead to mutual coupling between adjacent electrical leads 130, 230, which may compromise signal integrity during operation of the integrated circuit package.

Mutual coupling between adjacent electrical leads of an integrated circuit device, especially at high frequencies, presents a difficult problem for integrated circuit package designers. The mutual coupling between adjacent electrical leads of an integrated circuit package, as well as between an electrical lead and other components of the integrated circuit package, may include mutual capacitance and mutual inductance, both of which are frequency dependent. Thus, as newer integrated circuit packages are being designed to operate in relatively higher frequency ranges—e.g., in the range of 100 MHz to 400 MHz and higher—the deleterious effects of mutual coupling on signal integrity become increasingly significant, and package designers must have tools available to quantify such effects. Mutual capacitances and mutual inductances within an integrated circuit package are commonly referred to as parasitic capacitance and parasitic inductance, or simply parasitics.

Shown in FIG. 5 is an electrical model of two adjacent electrical leads 130a, 130b in the conventional BGA package 100. The electrical lead 130a includes a resistance 801a, an inductance 802a, and a capacitance 803a. Similarly, the electrical lead 130b includes a resistance 801b, an inductance 802b, and a capacitance 803b. The electrical model depicted in FIG. 5 is commonly referred to as a "lumped" model.

Referring to FIG. 5, the resistance 801a comprises the individual resistances of the bond wire 138, the conductive trace 136, the conductive via 134, the conductive pad 133, and the ball lead 132 of electrical lead 130a. The inductance 802a comprises the individual inductances of the bond wire 138, the conductive trace 136, the conductive via 134, the conductive pad 133, and the ball lead 132 of electrical lead 130a, and further includes mutual inductances generated between the electrical lead 130a and the adjacent electrical lead 130b, as well as between the electrical lead 130a and other components of the BGA package 100. The capacitance 803a comprises the individual capacitances of the bond wire 138, the conductive trace 136, the conductive via 134, the conductive pad 133, and the ball lead 132 of electrical lead 130a, and further includes mutual capacitances generated between the electrical lead 130a and the adjacent electrical lead 130b, as well as between the electrical lead 130a and other components of the BGA package 100. The mutual inductances and mutual capacitances are, at least in part, dependent upon the configuration of, and the distance between, the adjacent electrical leads 130a, 130b and upon the magnitude and frequency of the electrical signals propagating through each of the adjacent electrical leads 130a, 130b, as well as through other surrounding electrical leads 130 and other components of the BGA package 100.

Similarly, the resistance 801b comprises the individual resistances of the bond wire 138, the conductive trace 136, the conductive via 134, the conductive pad 133, and the ball lead 132 of the electrical lead 130b. The inductance 802b comprises the individual inductances of the bond wire 138, the conductive trace 136, the conductive via 134, the conductive pad 133, and the ball lead 132 of electrical lead 130b, and further includes mutual inductances generated between the electrical lead 130b and the adjacent electrical lead 130a, as well as between the electrical lead 130b and other components of the BGA package 100. The capacitance 803b comprises the individual capacitances of the bond wire 138, the conductive trace 136, the conductive via 134, the conductive pad 133, and the ball lead 132 of electrical lead 130b, and further includes mutual capacitances generated between the electrical lead 130b and the adjacent electrical lead 130a, as well as between the electrical lead 130b and other components of the BGA package 100. Again, the mutual inductances and mutual capacitances are, at least in part, dependent upon the configuration of, and the distance between, the adjacent electrical leads 130b, 130a and upon the magnitude and frequency of the electrical signals propagating through each of the adjacent electrical leads 130b, 130a, as well as through other surrounding electrical leads 130 and other components of the BGA package 100.

Shown in FIG. 6 is an electrical model of two adjacent electrical leads 230a, 230b in the conventional TSOP 200. The electrical lead 230a includes a resistance 901a, an inductance 902a, and a capacitance 903a. Similarly, the electrical lead 230b includes a resistance 901b, an inductance 902b, and a capacitance 903b. The electrical model depicted in FIG. 6 is commonly referred to as a "lumped" model, as noted above.

Referring to FIG. 6, the resistance 901a comprises the individual resistances of the bond wire 238, the internal portion 234, and the external portion 232 of electrical lead 230a. The inductance 902a comprises the individual inductances of the bond wire 238, the internal portion 234, and the external portion 232 of electrical lead 230a, and further includes mutual inductances generated between the electrical lead 230a and the adjacent electrical lead 230b, as well as between the electrical lead 230a and other components of the TSOP 200. The capacitance 903a comprises the individual capacitances of the bond wire 238, the internal portion 234, and the external portion 232 of electrical lead 230a, and further includes mutual capacitances generated between the electrical lead 230a and the adjacent electrical lead 230b, as well as between the electrical lead 230a and other components of the TSOP 200. The mutual inductances and mutual capacitances are, at least in part, dependent upon the configuration of, and the distance between, the adjacent electrical leads 230a, 230b and upon the magnitude and frequency of the electrical signals propagating through each of the adjacent electrical leads 230a, 230b, as well as through other surrounding electrical leads 230 and other components of the TSOP 200.

Similarly, the resistance 901b comprises the individual resistances of the bond wire 238, the internal portion 234, and the external portion 232 of electrical lead 230b. The inductance 902b comprises the individual inductances of the bond wire 238, the internal portion 234, and the external portion 232 of electrical lead 230b, and further includes mutual inductances generated between the electrical lead 230b and the adjacent electrical lead 230a, as well as between the electrical lead 230b and other components of the TSOP 200. The capacitance 903b comprises the individual capacitances of the bond wire 238, the internal portion 234, and the external portion 232 of electrical lead 230b, and further includes mutual capacitances generated between the electrical lead 230b and the adjacent electrical lead 230a, as well as between the electrical lead 230b and other components of the TSOP 200. Again, the mutual inductances and mutual capacitances are, at least in part, dependent upon the configuration of, and the distance between, the adjacent electrical leads 230b, 230a and upon the magnitude and frequency of the electrical signals propagating through each of the adjacent electrical leads 230b, 230a, as well as through other surrounding electrical leads 230 and other components of the TSOP 200.

Mutual coupling between the electrical leads of an integrated circuit package, and between an electrical lead and other components of the integrated circuit package, are often difficult for the integrated circuit package designer to accurately model, either by direct computation methods or by using computer-based simulation techniques. However, integrated circuit package characterization is a critical, if not essential, aspect of the integrated circuit package design process. Package designers must be able to verify that a proposed package configuration will behave electrically as intended, and that parasitic capacitances and inductances will not compromise signal integrity. Thus, in addition to modeling the electrical behavior of an integrated circuit package design using direct computation methods or computer-based simulation, it is often desirable to directly measure certain electrical characteristics—such as parasitic capacitance and inductance—of an integrated circuit package design using measuring instruments in order to validate the electrical model.

One type of conventional measuring instrument routinely used to measure inductance and capacitance is what is often referred to as an RLC meter. There are numerous types of RLC meters commercially available from a number of manufacturers; however, most conventional RLC meters suffer from the same limitation—i.e., the inability to accurately measure inductance and capacitance at high frequencies. Conventional RLC meters have an upper frequency limit of approximately 13 MHz. As noted above, new integrated circuit packages are being designed to operate in frequency ranges of 100 MHz to 400 MHz and higher, requiring that package characterization be performed at frequencies up to 3 GHz and higher in order to obtain accurate data. Thus, for newer integrated circuit packages designed to operate at relatively high frequencies, conventional RLC meters will not provide an accurate indication of the potential for mutual coupling in an integrated circuit package during operation.

One type of measuring instrument that has demonstrated an ability to provide relatively accurate measurements of parasitic capacitances and inductances in integrated circuit packages is a vector network analyzer (VNA), which may simply be referred to as a network analyzer. Generally, a network analyzer is a two-port measuring device having the ability to send a test signal or signals to a device under test (DUT) from one port and to receive a reflected signal or signals from the DUT at the same port. The ratio of the reflected signal to the original test signal (or a ratio of the average of the reflected signals to the original test signal if multiple test signals are sent) may be used to calculate what is commonly referred to as the $S_{11}$ parameter or the $S_{22}$ parameter. Use of a network analyzer to measure a reflected signal or signals is often referred to as using the network analyzer in the "$S_{11}$ mode." Alternatively, the network analyzer may send a test signal or signals to a DUT from one port and receive a signal or signals transmitted through the DUT at the other port. The ratio of the transmitted signal to the original test signal (or a ratio of the average of the transmitted signals to the original test signal if multiple test signals are sent) may be used to calculate what is commonly referred to as the $S_{12}$ parameter or the $S_{21}$ parameter. Use of a network analyzer to measure the transmitted signal or signals is often referred to as using the network analyzer in the "$S_{12}$ mode." Each port of the network analyzer is adapted to both send and receive high frequency electrical signals in the 3 GHz range as well as higher frequencies. The $S_{11}$, $S_{12}$, $S_{21}$, and $S_{22}$ parameters are often referred to as "scatter" parameters.

Although traditionally used by radio frequency and transmission line designers, a network analyzer may be used to characterize integrated circuit packages. In the $S_{11}$ mode, a network analyzer can be configured to send a high frequency test signal or signals to a selected lead or leads of an integrated circuit package and to measure the signal or signals reflected back from the integrated circuit package. Contact between a port of the network analyzer and a lead or leads of the integrated circuit package can be established by a test probe, such as a coaxial probe, electrically connected to the port of the network analyzer. The power exhibited by the reflected signal (or the average power of multiple reflected signals if more than one test signal is sent) received from the integrated circuit package is directly related to the impedance of the integrated circuit package and to the impedance of the network analyzer and test probe. By appropriate test setup and calibration, the impedance of the network analyzer and test probe can be removed from the measured data, such that the impedance indicated by the network analyzer is substantially that of the integrated circuit package. Also, the network analyzer may be configured to provide capacitance and inductance data for the integrated circuit package in a Smith chart format (see FIGS. 16 and 17).

Thus, a network analyzer may be used to measure the parasitic capacitances and inductances at high frequencies of one or more electrical leads of an integrated circuit package. However, though it is known in the art to use network analyzers to measure high frequency parasitics in an integrated circuit package, conventional apparatus and methods for acquiring such data utilize complex and expensive test fixtures and methods. For the integrated circuit package designer, who may need an indication of the potential for mutual coupling in a proposed package design at an intermediate phase of the design process, a relatively simple, fast, and low-cost method for measuring parasitic capacitances and inductances is preferred.

Therefore, a need exists in the art for apparatus and methods for determining the susceptibility of a proposed integrated circuit package design to mutual coupling between electrical leads, or between an electrical lead and other components of the integrated circuit device package, using a network analyzer. Such apparatus and methods must provide a relatively simple and low-cost approach to integrated circuit package characterization.

BRIEF SUMMARY OF THE INVENTION

The present invention provides apparatus and methods for measuring parasitic capacitances and inductances in integrated circuit packages using a network analyzer in conjunction with a coaxial probe. According to the invention, simple and low-cost test fixturing and methods of testing may be used to measure the parasitic capacitance and inductance of one or more I/O leads of an integrated circuit package to provide a package designer with an indication of the susceptibility of the integrated circuit package, or a proposed package design, to mutual coupling between electrical leads or between an electrical lead and other components of the integrated circuit package. Further, parasitics of an integrated circuit package may be measured according to the invention to validate an electrical model used by the package designer to model such electrical phenomena.

A method of measuring the parasitic capacitance of an I/O lead of a conventional BGA package comprises configuring all of the electrical leads of the BGA package as electrically open and contacting a signal conductor of a coaxial probe to the I/O lead of interest and contacting a ground conductor of the coaxial probe to an adjacent electrical lead, forcing the adjacent electrical lead to ground potential. Test signal or signals—of, optionally, sweeping frequency—are provided by a network analyzer via the signal conductor of the coaxial probe to the I/O lead of interest, and a reflected signal or signals from the BGA package are measured by the network analyzer. The network analyzer then indicates a parasitic capacitance of the I/O lead of interest based on the power of the reflected signal (or on the average power if multiple reflected signals are present).

In another variation, all of the ball leads in a row or column of ball leads may be electrically interconnected to provide a larger ground reference point and to facilitate contact with the ground conductor of the coaxial probe. In a further embodiment, a voltage is applied to a semiconductor die of the BGA package to power the die, and thereby to at least partially simulate actual operation of the BGA package during testing. In yet another embodiment, the BGA package is characterized without a semiconductor die.

A method of measuring the parasitic capacitance of an I/O lead of a conventional TSOP, or other integrated circuit package configuration utilizing lead frame construction, comprises securing the TSOP to a novel test substrate configured to allow the I/O leads of the TSOP to "float" with respect to the test substrate. The test substrate includes a conductive layer configured for providing a ground plane and may also include one or more isolated conductive traces for powering a semiconductor die during testing. The test substrate may be constructed from printed circuit board (PCB) materials according to conventional PCB fabrication techniques. At least the I/O leads of the TSOP are configured as electrically open and the signal conductor of the coaxial probe is contacted against an I/O lead of interest and the ground conductor of the coaxial probe is contacted against the conductive layer, or ground plane, of the test substrate. Test signal or signals—of, optionally, sweeping frequency—are provided by the network analyzer via the signal conductor of the coaxial probe to the I/O lead of interest, and a reflected signal or signals from the TSOP are measured by the network analyzer. The network analyzer then indicates a parasitic capacitance of the I/O lead of interest based on the power of the reflected signal (or on the average power if multiple reflected signals are present).

In another variation, a voltage is applied to a semiconductor die of the TSOP via the isolated conductive trace or traces to power the die, and thereby to at least partially simulate actual operation of the TSOP package during testing. In a further embodiment, the TSOP package is characterized without a semiconductor die. In yet another embodiment, one or more of the electrical leads of the TSOP is contacted against an isolated pad formed in the conductive layer of the test substrate to provide a surface upon which an external portion of an electrical lead of the TSOP can contact and be secured to.

A method of measuring the parasitic inductance of an I/O lead of the conventional BGA package comprises removing the semiconductor die from the BGA package or, alternatively, constructing a "dummy" package having no die and forming a central conductive plane on a surface of a substrate of the BGA package. At least the I/O leads of the BGA package that are to be characterized are electrically connected to the central conductive plane to establish continuity between these electrical leads. The signal conductor of the coaxial probe is contacted against an I/O lead of interest and the ground conductor of the coaxial probe is contacted against any adjacent electrical lead of the BGA package that is also electrically connected to the central conductive plane. Test signal or signals—of, optionally, sweeping frequency—are provided by the network analyzer via the signal conductor of the coaxial probe to the I/O lead of interest, and a reflected signal or signals from the BGA package are measured by the network analyzer. The network analyzer then indicates a parasitic inductance of the I/O lead of interest based on the power of the reflected signal (or on the average power if multiple reflected signals are present). In a variation of this approach, all of the electrical leads of the BGA package are electrically connected to the central conductive plane.

A method of measuring the parasitic inductance of an I/O lead of the conventional TSOP comprises removing the semiconductor die from the TSOP or, alternatively, constructing a "dummy" package having no die and forming a central conductive plane on a die-attach pad of the TSOP. At least the I/O leads of the TSOP that are to be characterized are electrically connected to the central conductive plane to establish continuity between these electrical leads. The signal conductor of the coaxial probe is contacted against an I/O lead of interest and the ground conductor of the coaxial probe is contacted against any adjacent electrical lead of the TSOP that is also electrically connected to the central conductive plane. Test signal or signals—of, optionally, sweeping frequency—are provided by the network analyzer via the signal conductor of the coaxial probe to the I/O lead of interest, and a reflected signal or signals from the TSOP are measured by the network analyzer. The network analyzer then indicates a parasitic inductance of the I/O lead of interest based on the power of the reflected signal (or on the average power if multiple reflected signals are present). In a variation of this approach, all of the electrical leads of the TSOP are electrically connected to the central conductive plane.

BRIEF DESCRIPTION OF THE SEVERAL VIEWS OF THE DRAWINGS

While the specification concludes with claims particularly pointing out and distinctly claiming that which is regarded as the present invention, the features and advantages of this invention can be more readily ascertained from the following detailed description of the invention when read in conjunction with the accompanying drawings, in which:

DETAILED DESCRIPTION OF THE INVENTION

The present invention provides a number of embodiments of apparatus and methods for measuring parasitic capacitances and inductances in integrated circuit packages using a network analyzer. Although the apparatus and methods according to the invention are described in relation to the conventional BGA package 100 and the conventional TSOP 200 shown and described with respect to FIGS. 1 and 2 and FIGS. 3 and 4, respectively, it should be understood by those of ordinary skill in the art that the present invention may be applicable to the characterization of any type of integrated circuit package.

Figure 7:
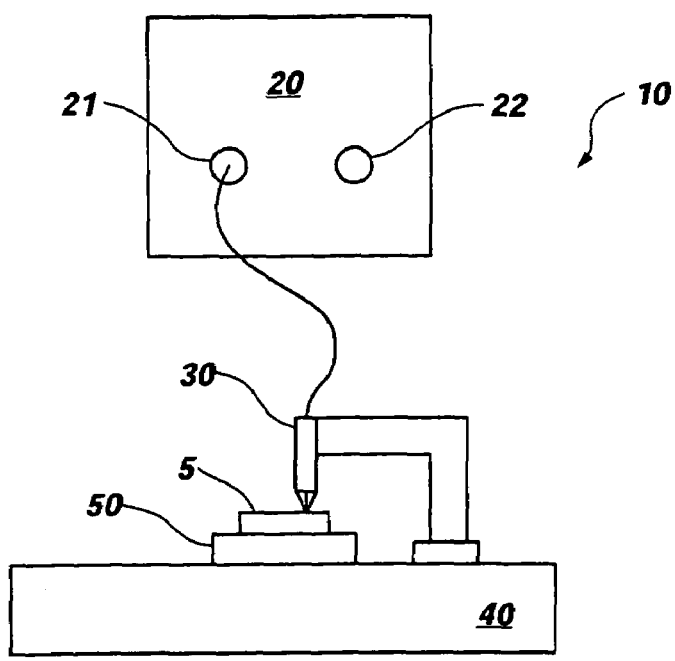
FIG. 7 shows a schematic diagram of an exemplary test system that may be used for integrated circuit package characterization according to the present invention.

As noted above, the present invention encompasses apparatus and methods for measuring both mutual capacitance and mutual inductance in an integrated circuit package using a network analyzer. Referring to FIG. 7, an exemplary embodiment of a test system 10 that may be used to measure parasitic capacitances and inductances of an integrated circuit package is shown. The test system 10 includes a network analyzer 20 having a first port 21 and a second port 22. The first port 21 (or, optionally, the second port 22) of the network analyzer 20 is electrically connected to a coaxial test probe 30. The coaxial test probe 30 is configured to establish electrical contact with one or more electrical leads of a device under test (DUT) 5, such as the conventional BGA package 100 or the conventional TSOP 200, which may be supported in a test fixture 50. Also, the coaxial test probe 30 may form a part of, or be supported in, a probe station 40, the probe station 40 being configured to provide accurate positioning of the coaxial test probe 30 relative to the DUT 5. The network analyzer 20 may be used in the $S_{11}$ mode (or, optionally, in the $S_{22}$ mode) to measure parasitic capacitances and inductances of the electrical leads of the DUT 5.

The exemplary test system 10 may include a network analyzer 20 comprising an HP 8753E Vector Network Analyzer manufactured by Hewlett Packard or an 8753ES Vector Network Analyzer manufactured by Agilent Technologies. The probe station 40 may comprise a GTL-4000 Series Precision Large-Area Probing System manufactured by GigaTest Labs. Further, the exemplary test system 10 may include a coaxial test probe 30 comprising a Picoprobe® Model 40A Microwave Probe manufactured by GGB Industries.

The exemplary test system 10 may be used, in conjunction with novel test fixturing and test methods according to the invention, to determine the potential for mutual coupling in an integrated circuit package, as will now be described in greater detail.

The present invention encompasses apparatus and methods for measuring parasitic capacitance in an integrated circuit package and apparatus and methods for measuring parasitic inductance in an integrated circuit package. The parasitic capacitance and inductance measurements are indicative of the susceptibility of an integrated circuit package to mutual coupling between electrical leads or between an electrical lead and other components of the integrated circuit package, which may compromise signal integrity, as noted above. The apparatus and methods of the present invention are described herein in the context of measuring parasitic capacitance in the conventional BGA package 100, measuring parasitic capacitance in the conventional TSOP 200, measuring parasitic inductance in the conventional BGA package 100, and measuring parasitic inductance in the conventional TSOP 200. However, it should be understood by those of ordinary skill in the art that the embodiments disclosed herein of apparatus and methods for measuring parasitic capacitances and inductances are applicable to the characterization of any type of integrated circuit package configuration known in the art, as noted above.

Figure 8:
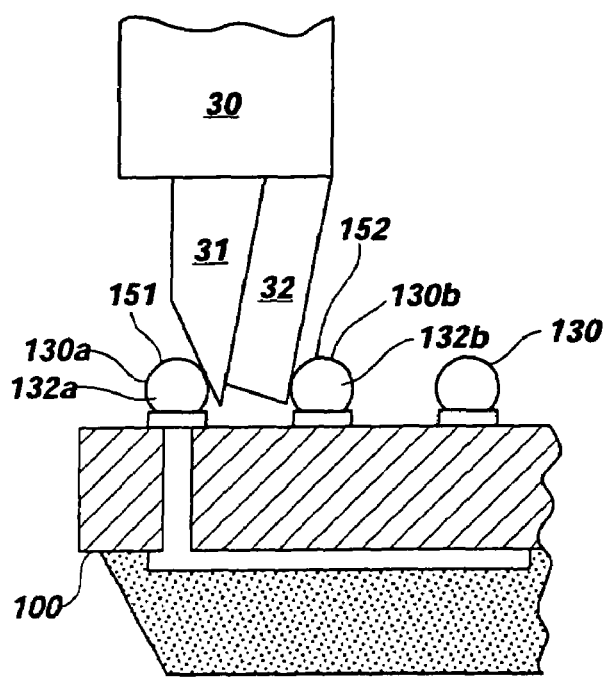
FIG. 8 shows a coaxial probe tip in contact with a pair of ball leads of the conventional BGA package to measure parasitic capacitance according to the present invention.

To measure the parasitic capacitance of an I/O lead 130 on the conventional BGA package 100, the BGA package 100 is mounted with the ball leads 132 facing upwards, as shown in FIG. 8. A coaxial test probe 30 is electrically connected to the first port 21 (or, optionally, the second port 22) of a network analyzer 20. The network analyzer 20 and coaxial test probe 30 are calibrated to the tip of the coaxial test probe 30. In other words, parasitic capacitances of the network analyzer 20 and coaxial test probe 30 will be removed from the measured data. The network analyzer 20 is then configured to operate in the $S_{11}$ mode (or, optionally, the $S_{22}$ mode), such that an electrical test signal or signals are sent from the first port 21 of the network analyzer 20 and a reflected signal or signals are received at the first port 21.

All of the electrical leads 130 of the conventional BGA package 100 must be configured as electrically open—i.e., no electrical lead 130 is electrically shorted to another electrical lead 130. Alternatively, the electrical leads 130 of the BGA package 100 may be configured to exhibit a high input impedance, such that the impedance between any two adjacent electrical leads 130 is sufficient to electrically isolate each electrical lead 130 from all adjacent electrical leads 130, each electrical lead 130 thereby being essentially electrically open.

Referring to FIG. 8, the coaxial test probe 30 is then contacted against the ball lead 132a of an electrical lead 130a that is to be characterized and the adjacent ball lead 132b of another electrical lead 130b. The tip of the coaxial test probe 30 comprises a signal conductor 31 and a ground conductor 32. The signal conductor 31 is contacted against the ball lead 132a of the I/O lead 130a to be characterized to establish electrical communication therebetween. Similarly, the ground conductor 32 is contacted against the adjacent ball lead 132b of the electrical lead 130b to establish electrical contact therebetween. The ground conductor 32 of the coaxial test probe 30 provides a ground potential and forces the electrical lead 130b to the ground potential.

To measure the parasitic capacitance of the I/O lead 130a, a test signal or signals are sent via the signal conductor 31 of the coaxial test probe 30 to the I/O lead 130a. A signal or signals reflected from the BGA package 100 through the I/O lead 130a will then be received by the coaxial test probe 30 and provided to the network analyzer 20. As noted above, the reflected signal or signals from the BGA package 100 can be directly related to the impedance of the I/O lead 130a. The network analyzer 20 is configured to equate the reflected signal or signals to an impedance measurement such that the parasitic capacitance can be determined. All of the I/O leads 130 of the BGA package 100, or a selected portion thereof, may be characterized in a similar manner.

The test signal or signals provided by the network analyzer 20 via the signal conductor 31 of the coaxial test probe 30 may comprise a frequency sweep in which signals increasing in frequency between a selected start frequency and a selected end frequency are provided to the I/O lead 130a. The network analyzer 20 may, therefore, provide an indication of the parasitic capacitance at various frequencies between the start and end frequencies. A typical frequency sweep may comprise, for example, a 401 point sweep providing data at 401 discrete frequency points between, and including, the start and end frequencies.

For the conventional BGA package 100 shown and described herein, the electrical leads 130 in the outer column 151 (as well as in inner column 153) are I/O leads and the electrical leads in the adjacent middle column 152 are either a $V_{CC}$, $V_{SS}$, or $V_{REF}$ lead. Thus, the electrical lead 130b having adjacent ball lead 132b comprises a $V_{CC}$ lead, a $V_{SS}$ lead, or a $V_{REF}$ lead and, again, the ground conductor 32 of the coaxial test probe 30 forces this $V_{CC}$, $V_{SS}$, or $V_{REF}$ lead to ground potential during testing. Although, for the conventional BGA package 100, each I/O lead 130 in the outer and inner columns 151, 161, 153, 163 will have a ball lead 132 that is adjacent to another ball lead 132 of a $V_{CC}$, $V_{SS}$, or $V_{REF}$ lead 130 in the middle columns 152, 162, an I/O lead 130 may be characterized by contacting the signal conductor 31 of the coaxial test probe 30 to that I/O lead and contacting the ground conductor 32 of the coaxial test probe 30 to an adjacent ball lead 132 of another I/O lead 130, which is then forced to ground potential. Thus, the parasitic capacitance of an I/O lead 130 may be measured between that I/O lead and any adjacent lead 130, so long as the adjacent lead is forced to ground potential by contact with the ground conductor 32 of the coaxial test probe 30. Further, it should be noted that, for accurate measurements to be obtained, ground potential should be provided by only the network analyzer 20.

Figure 1:
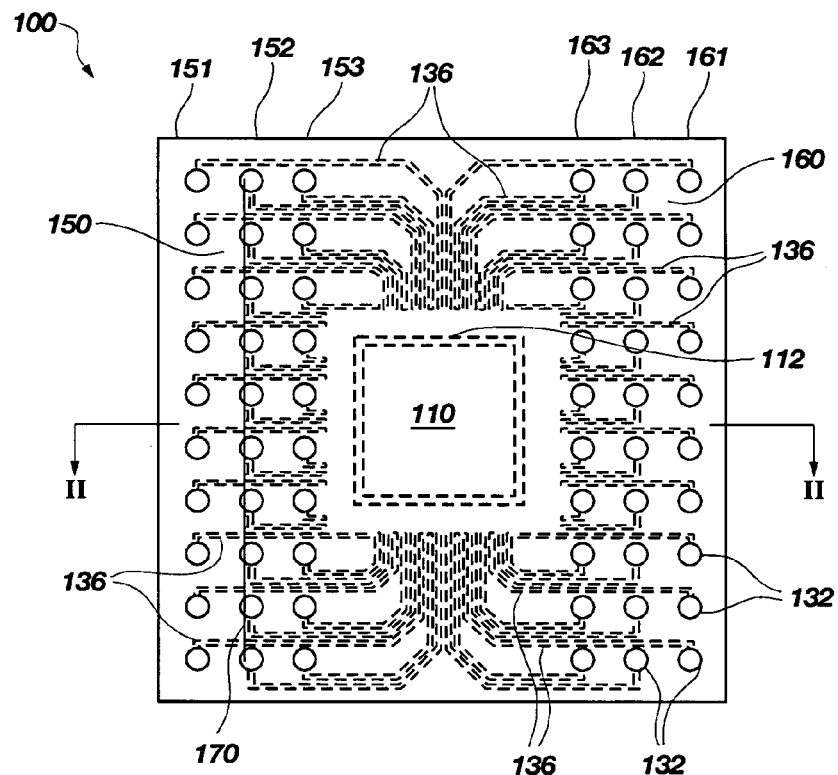
FIG. 1 shows a bottom view of an exemplary embodiment of a conventional BGA package.
Figure 2:
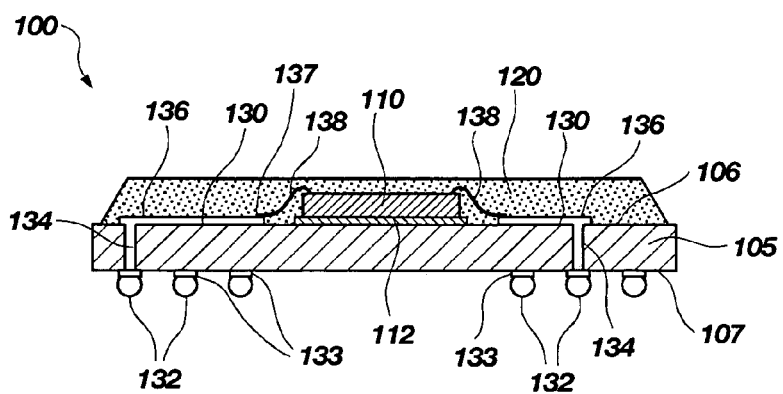
FIG. 2 shows a cross-sectional view of the conventional BGA package as taken along line II—II of FIG. 1.
Figure 3:
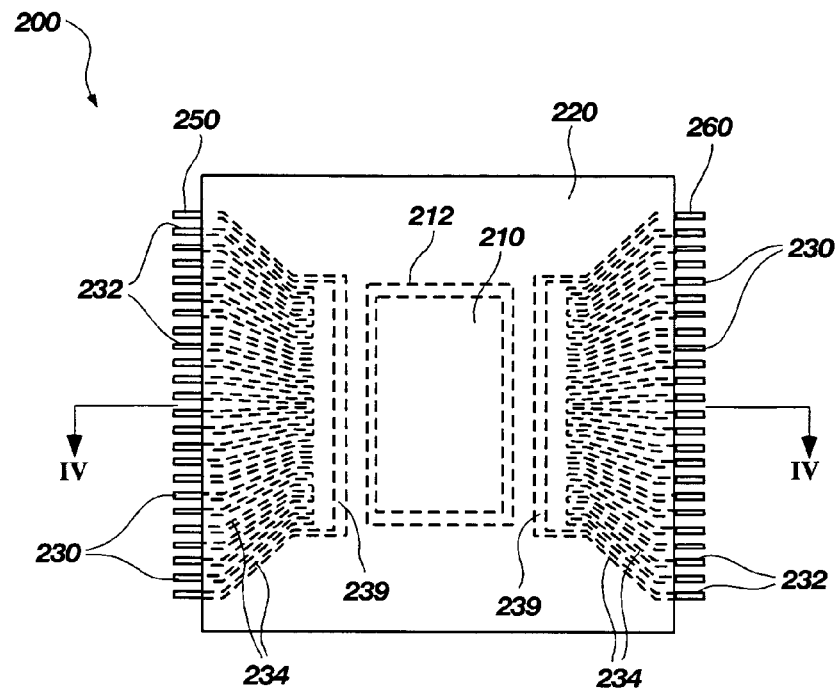
FIG. 3 shows a top view of an exemplary embodiment of a conventional TSOP.
Figure 4:
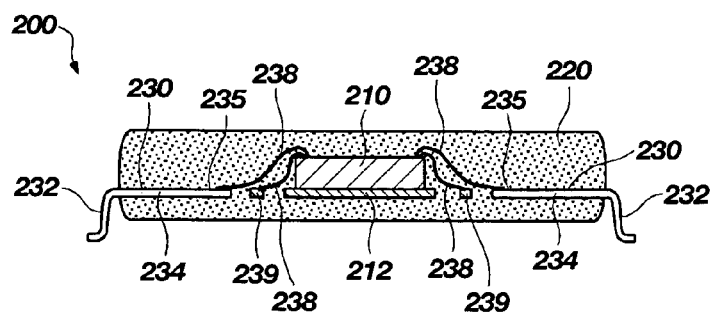
FIG. 4 shows a cross-sectional view of the conventional TSOP as taken along line IV—IV of FIG. 3.
Figure 5:
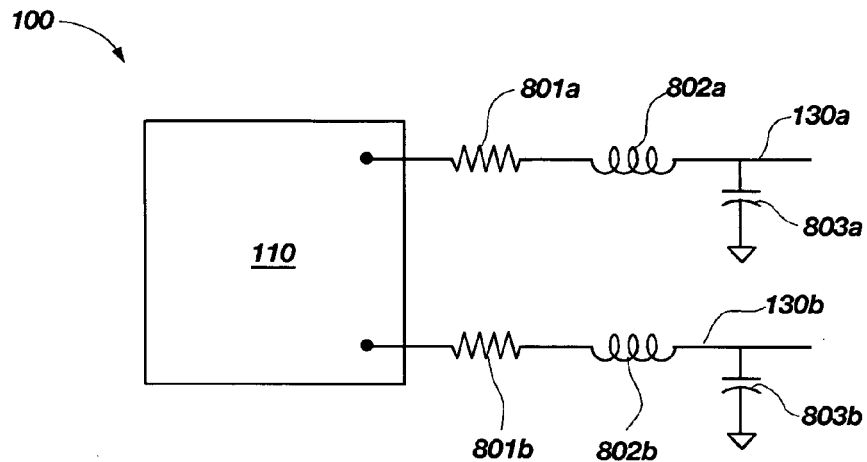
FIG. 5 shows an equivalent circuit of two adjacent electrical leads in the conventional BGA package.
Figure 6:
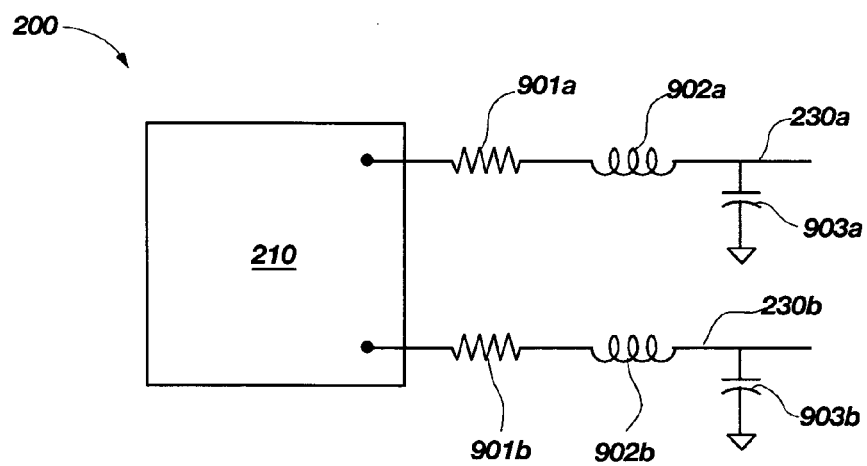
FIG. 6 shows an equivalent circuit of two adjacent electrical leads in the conventional TSOP.

In an alternative embodiment, all of the electrical leads 130 in the middle column 152 (and/or middle column 162) may be electrically interconnected by, for example, a wire or bus bar 170, as shown in FIG. 1. The wire or bus bar 170 may be attached to the ball leads 132 in the middle column 152 using solder or conductive epoxy or, alternatively, may be secured against all of the ball leads 132 in the middle column 152 by a clamping device or other fixture (not shown). The interconnected electrical leads 130 of the middle column 152 provide a larger ground reference point and may facilitate contact with the ground conductor 32 of the coaxial test probe 30.

In a further embodiment, a voltage is applied to one or more of the $V_{CC}$ leads on the conventional BGA package 100 to power the semiconductor die 110 during testing. During operation of the BGA package 100, functioning of the semiconductor die 110 may itself introduce or effect the parasitic capacitances and inductances in the I/O leads 130 electrically connected thereto. Powering the semiconductor die 110 of the BGA package 100 during testing may, therefore, provide an indication of the mutual coupling that may occur within the BGA package 100 during actual operation.

In yet another embodiment, the semiconductor die 110 of the conventional BGA package 100 may be removed (or a "dummy" BGA package constructed without a semiconductor die 110) for testing. In this embodiment, only the electrical leads 130 and substrate 105 are characterized during a test sequence.

Figure 9:
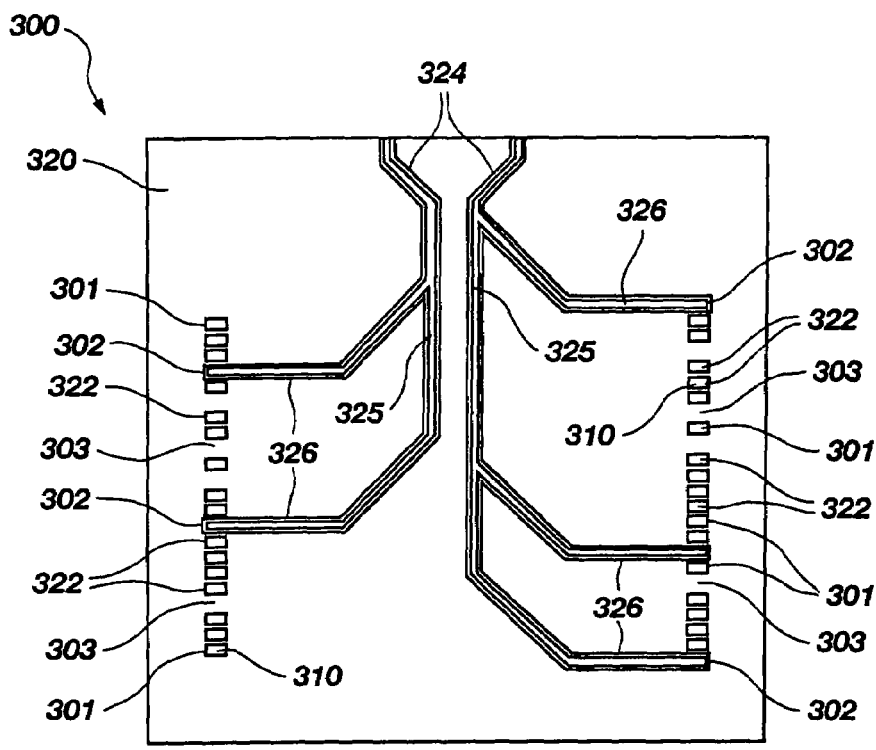
FIG. 9 shows a test substrate according to the present invention for use in measuring parasitic capacitance of an electrical lead of the conventional TSOP.
Figure 10:
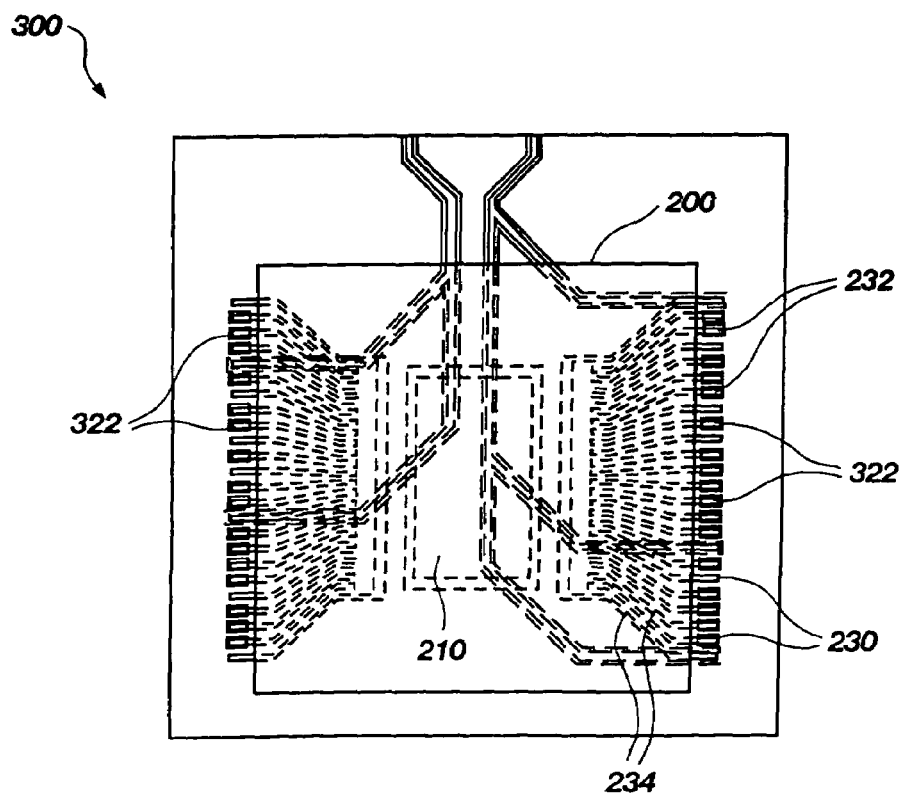
FIG. 10 shows the test substrate of FIG. 9 having the conventional TSOP disposed thereon for measuring parasitic capacitance according to the present invention.
Figure 11:
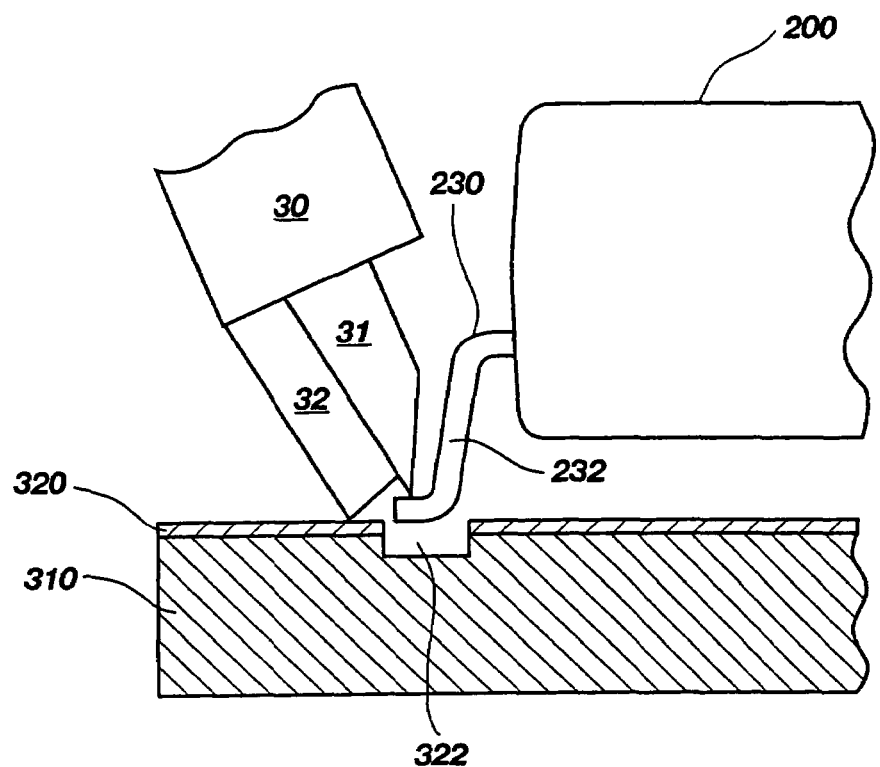
FIG. 11 shows a coaxial probe tip in contact with a lead of the conventional TSOP and a surface of the test substrate of FIG. 9 to measure parasitic capacitance according to the present invention.

To measure the parasitic capacitance of an electrical lead 230 of the conventional TSOP 200, the TSOP 200 is secured to a test substrate configured to allow the I/O leads 230 of the conventional TSOP 200 to "float." Referring to FIGS. 9, 10, and 11, the test substrate 300 comprises an insulative base layer 310 and a conductive layer 320 formed on a surface of the insulative base layer 310. The insulative base layer 310 may be comprised of any suitable dielectric or electrically insulating material, and the conductive layer 320 may comprise any suitable conductive material known in the art. By way of example, the test substrate 300 may simply comprise a printed circuit board (PCB) material, such as FR-4 or other fiberglass materials, having a layer of copper formed on a surface thereof. Such a test substrate 300 may be formed using conventional PCB fabrication techniques. At locations 301 on the test substrate 300 corresponding to locations of the external portion 232 of the I/O leads 230 of the TSOP 200 to be secured thereon, a cavity 322 is formed through at least the conductive layer 320 to expose the insulative base layer 310 lying underneath conductive layer 320. The cavity 322 may also extend a depth into the insulative base layer 310.

One or more isolated conductive traces 324 may also be formed in the conductive layer 320 of the test substrate 300. The conductive trace or traces 324 each comprise a trunk line 325 having one or more branch lines 326 extending therefrom, each branch line 326 terminating at a location 302 corresponding to a location of the external portion 232 of a $V_{CC}$ lead 230 of the TSOP 200 to be secured to the test substrate 300. The isolated conductive traces 324 provide an electrical path to the semiconductor die 210 of the conventional TSOP 200 for powering the semiconductor die 210 during testing.

At locations 303 on the test substrate 300 corresponding to locations of the $V_{SS}$ and $V_{REF}$ leads 230 of the TSOP 200 to be secured thereon, the conductive layer 320 has not been removed. The conductive layer 320, therefore, provides a ground plane to which the $V_{SS}$ and $V_{REF}$ leads 230 of the conventional TSOP 200 can be electrically connected for testing.

Referring to FIGS. 10 and 11, to measure the parasitic capacitance of an electrical lead 230 of the TSOP 200, the TSOP 200 is secured to the test substrate 300 such that all I/O leads 230 of the TSOP 200 are each disposed at one of the locations 301 (see FIG. 9) on the test substrate 300 and are suspended over one of the cavities 322 formed in the conductive layer 320. Thus, the external portion 232 of each electrical lead 230 does not make contact with any surface of the test substrate 300, as shown in FIG. 11. All of the $V_{CC}$ leads 230 of the TSOP 200 are each disposed at one of the locations 302 on the test substrate 300 and are electrically connected to one of the branch lines 326 of the isolated conductive traces 324. Further, all of the $V_{SS}$ and $V_{REF}$ leads 230 of the TSOP 200 are each disposed at one of the locations 303 on the test substrate 300 and are electrically connected to the conductive layer 320. The TSOP 200 may be secured to the test substrate 300 by attaching the external portion 232 of each $V_{CC}$, $V_{SS}$, and $V_{REF}$ lead 230 to the test substrate 300 using solder or, alternatively, the TSOP 200 may be secured to the test substrate 300 with any type of clamping device (not shown).

As shown in FIG. 7, coaxial test probe 30 is electrically connected to the first port 21 (or, optionally, the second port 22) of a network analyzer 20. The network analyzer 20 and coaxial test probe 30 are calibrated to the tip of the coaxial test probe 30. In other words, parasitic capacitances of the network analyzer 20 and coaxial test probe 30 will be removed from the measured data, as noted above. The network analyzer 20 is then configured to operate in the $S_{11}$ mode (or, optionally, the $S_{22}$ mode), such that electrical test signal or signals are sent from the first port 21 of the network analyzer 20 and the reflected signal or signals are received at the first port 21.

All of the electrical leads 230 of the conventional TSOP 200 must be configured as electrically open—i.e., no electrical lead 230 is electrically shorted to another electrical lead 230 (other than the $V_{SS}$ and $V_{REF}$ leads which are coupled to the conductive layer 320 of the test substrate 300). Alternatively, the electrical leads 230 of the TSOP 200 may be configured to exhibit a high input impedance, such that the impedance between any two adjacent electrical leads 230 is sufficient to electrically isolate each electrical lead 230 from all adjacent electrical leads 230. Each electrical lead 230 is, therefore, essentially electrically open.

Referring to FIG. 11, the coaxial test probe 30 is then contacted against the external portion 232—which, again, is free-floating with respect to the test substrate 300—of an electrical lead 230 that is to be characterized and the conductive layer 320 on the test substrate 300. The signal conductor 31 is contacted against the external portion 232 of the electrical lead 230 to be characterized to establish electrical communication therebetween. Similarly, the ground conductor 32 is contacted against the conductive layer 320 to establish electrical contact therebetween. The ground conductor 32 of the coaxial test probe 30 forces the conductive layer 320 to the ground potential and, as noted above, in order to obtain accurate data, ground potential should be provided by only the network analyzer 20.

To measure the parasitic capacitance of the electrical lead 230, a test signal or signals are sent via the signal conductor 31 of the coaxial test probe 30 to the electrical lead 230. The signal or signals reflected from the TSOP 200 through the electrical lead 230 will then be received by the coaxial test probe 30 and provided to the network analyzer 20. The reflected signal or signals from the TSOP 200 can be directly related to the impedance of the electrical lead 230. The network analyzer 20 is configured to equate the reflected signal or signals to an impedance measurement such that the parasitic capacitance can be determined. Because the external portion 232 of the electrical lead 230 being characterized is free-floating with respect to the test substrate 300 (i.e., not contacting any surface of the test substrate 300), any parasitic capacitance present in the test substrate 300 will not be measured by the network analyzer 20. The parasitic capacitance of all of the I/O leads 230 of the TSOP 200, or a selected portion thereof, may similarly be measured.

As noted above, the test signal or signals provided by the network analyzer 20 via the signal conductor 31 of the coaxial test probe 30 may comprise a frequency sweep in which signals increasing in frequency between a selected start frequency and a selected end frequency are provided to the electrical lead 230, thereby providing an indication of the parasitic capacitance at various frequencies at and between the start and end frequencies.

In an alternative embodiment, a voltage is applied to one or more of the $V_{CC}$ leads on the conventional TSOP 200 to power the semiconductor die 210 during testing. The voltage potential is applied to the $V_{CC}$ leads via the isolated conductive traces 324 (each comprising trunk line 325 and branch line or lines 326). During operation of the TSOP 200, functioning of the semiconductor die 210 may itself introduce or effect the parasitic capacitances and inductances in the I/O leads 230 electrically connected thereto. Accordingly, powering the semiconductor die 210 of the TSOP 200 during testing may provide an indication of the mutual coupling that may occur within the TSOP 200 during actual operation. If it is not desired to power the semiconductor die 210 during testing, the isolated conductive traces 324 may be electrically connected to the conductive layer 320 to force the $V_{CC}$ leads to ground potential upon contact between the ground conductor 32 of the coaxial test probe 3.0 and the conductive layer 320.

In a further embodiment, the semiconductor die 210 of the conventional TSOP 200 may be removed for testing (or a "dummy" TSOP constructed without a semiconductor die 210). In this embodiment, only the electrical leads 230 (as well as other portions of a lead frame) are characterized during a test sequence. With the semiconductor die 210 removed, the isolated conductive traces 324 may be electrically connected to the conductive layer 320, such that the $V_{CC}$ leads are also forced to ground potential by contact of the ground conductor 32 of the coaxial test probe 30 with the conductive layer 320.

Figure 12:
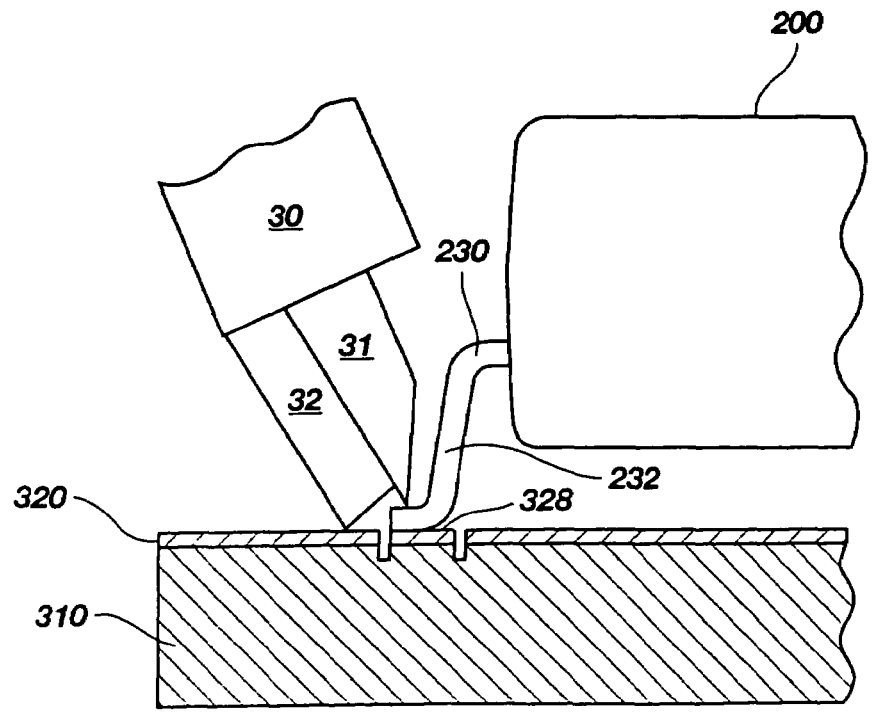
FIG. 12 shows a coaxial probe tip in contact with a lead of the conventional TSOP and a surface of another embodiment of a test substrate according to the present invention for measuring parasitic capacitance.

In yet another embodiment, as shown in FIG. 12, an isolated pad 328 is formed in the conductive layer 320 of the test substrate 300 at each of the locations 301 corresponding to the locations of the external portion 232 of the I/O leads 230 of the TSOP 200 to be secured on the test substrate 300 for characterization. The isolated pads 328 provide a surface upon which the external portion 232 of each electrical lead 230 of the TSOP 200 can rest and, if desired, be attached to. However, the isolated pads 328 electrically isolate each electrical lead 230 from the conductive layer 320, which is forced to ground potential during testing. In this embodiment, because the I/O leads 230 are in contact with the test substrate 300, the test substrate 300 must be characterized prior to testing of an integrated circuit package, such that the parasitic capacitance of each isolated pad 328 is known and can be subtracted from the measured parasitic capacitance for an electrical lead 230 in contact therewith. Characterization of the I/O leads 230 of the TSOP 200 then proceeds as described above.

Figure 16:
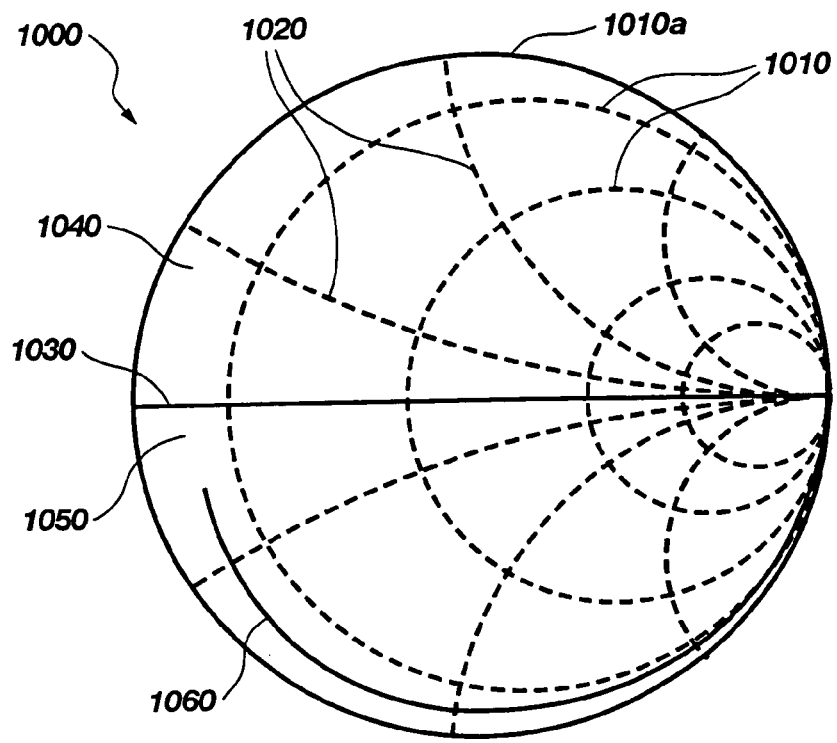
FIG. 16 shows parasitic capacitance data for an integrated circuit package presented in a Smith chart format.

Referring to FIG. 16, exemplary data for the parasitic capacitance of an I/O lead of an integrated circuit package is shown. The data is presented in a Smith chart 1000 format, which may be provided directly by the network analyzer 20. The Smith chart 1000 includes mutually orthogonal lines of constant resistance 1010 and lines of constant reactance 1020, which may be either capacitive or inductive. The outermost line of constant resistance 1010a corresponds to a resistance of zero. In the portion 1040 above the central axis 1030 of the Smith chart 1000 the reactance is inductive, and in the portion 1050 below the central axis 1030 the reactance is capacitive. A generally smooth curve 1060 depicts the parasitic capacitance for an I/O lead of an integrated circuit package measured according to the present invention. The smooth curve 1060 represents a best-fit curve connecting a selected number of individual parasitic capacitance data points measured, at selected, discrete frequencies.

Figure 13:
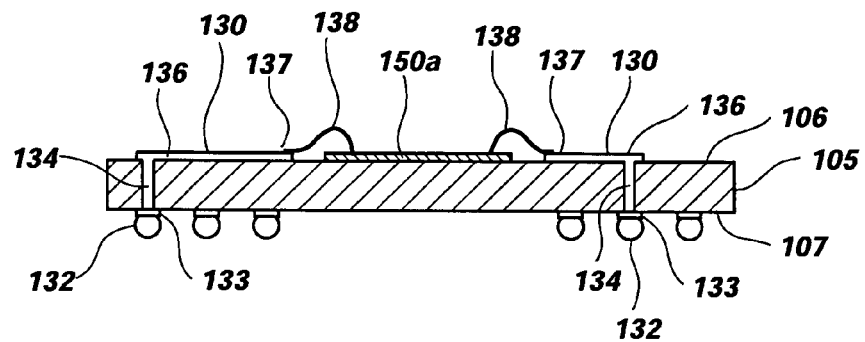
FIG. 13 shows a portion of the conventional BGA package having a central conductive plane according to the present invention for measuring parasitic inductance.
Figure 14:
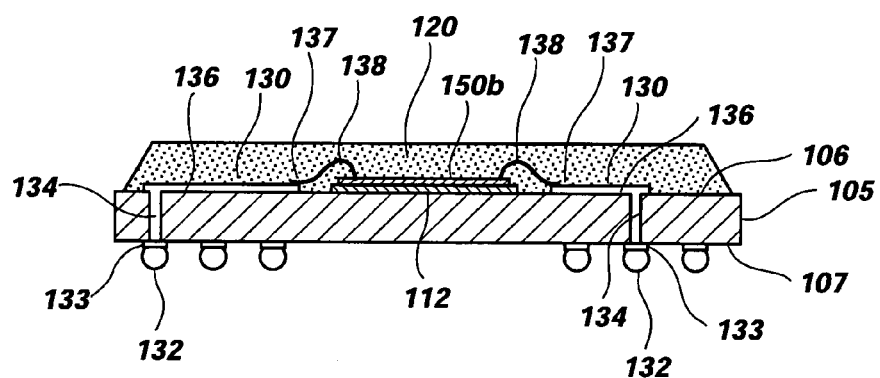
FIG. 14 shows a portion of the conventional BGA package having a central conductive plane according to another embodiment of the present invention for measuring parasitic inductance.

To measure the parasitic inductance of an I/O lead 130 of the conventional BGA package 100, the semiconductor die 110 is removed from the BGA package 100 (or a "dummy" BGA package is constructed without a semiconductor die 110) and all of the electrical leads 130 of the BGA package are electrically connected to a central conductive plane. Referring to FIG. 13, the central conductive plane 150a may be formed directly on the substrate 105 at a location substantially corresponding to a location of the die-attach pad 112 (which has been removed or, alternatively, a "dummy" BGA package is constructed without the die-attach pad 112). Bond wires 138 may be used to electrically connect the bond end 137 of each electrical lead 130 to the central conductive plane 150a. In another embodiment, as shown in FIG. 14, the central conductive plane 150b is formed on the die-attach pad 112 and a bond wire 138 may be used to electrically connect the bond end 137 of each electrical lead 130 to the central conductive plane 150b. In a further embodiment, an encapsulant material 120 may be formed over the upper surface 106 of the substrate 105 to encapsulate at least a portion of each electrical lead 130 and the central conductive plane 150a, 150b, as shown in FIGS. 13 and 14.

The central conductive plane 150a, 150b may be constructed of any suitable conductive material and according to any suitable methods known in the art. For example, the central conductive plane 150a, 150b may, for example, comprise an alumina substrate formed on the substrate 105 or die-attach pad 112 or a layer of conductive epoxy adhered to the substrate 105 or die-attach pad 112. Although shown in FIGS. 13 and 14 as a generally planar structure, the central conductive plane 150a, 150b may be of any suitable shape or configuration, so long as the central conductive plane 150a, 150b provides a point at which continuity may be established between the electrical leads 130 of the BGA package 100.

A coaxial test probe 30 is electrically connected to the first port 21 (or, optionally, the second port 22) of a network analyzer 20. The network analyzer 20 and coaxial test probe 30 are calibrated to the tip of the coaxial test probe 30, such that the parasitic inductances of the network analyzer 20 and coaxial test probe 30 are removed from the measured data. The network analyzer 20 is then configured to operate in the $S_{11}$ mode (or, optionally, the $S_{22}$ mode), such that electrical test signal or signals are sent from the first port 21 of the network analyzer 20 and the reflected signal or signals are received at the first port 21.

Referring again to FIG. 8, the coaxial test probe 30 is then contacted against the ball lead 132a of an I/O lead 130a that is to be characterized and an adjacent ball lead 132b of another electrical lead 130b. The signal conductor 31 is contacted against the ball lead 132a of the I/O lead 130a to be characterized to establish electrical communication therebetween and, similarly, the ground conductor 32 is contacted against the adjacent ball lead 132b of the electrical lead 130b to establish electrical contact therebetween. A circuit is thus formed between the ball lead 132a and the ball lead 132b having an inductance therebetween comprising the individual parasitic inductance of the I/O lead 130a to be characterized and the individual parasitic inductance of the other electrical lead 130b, which are in series.

To measure the parasitic inductance of the I/O lead 130a, a test signal or signals are sent via the signal conductor 31 of the coaxial test probe 30 to the I/O lead 130a. A signal or signals reflected from the BGA package 100 through the I/O lead 130a will then be received by the coaxial test probe 30 and be provided to the network analyzer 20. The reflected signal or signals from the BGA package 100 can be directly related to the impedance of the I/O lead 130a. The network analyzer 20 is configured to equate the reflected signal or signals to an impedance measurement such that the parasitic inductance can be determined. However, because the parasitic inductance of the electrical lead 130b is being added in series to the parasitic inductance of the I/O lead 130a being characterized, the measured parasitic inductance is divided by two to obtain the individual parasitic inductance of the I/O lead 130a. This result assumes, of course, that the parasitic inductances of the two adjacent electrical leads 130a, 130b are approximately equal. This assumption will introduce some error into the measured data due to differences in length, thickness, and width of the adjacent electrical leads 130a, 130b; however, it is believed that, for the purpose of package characterization during the design process, such errors will not be significant. All of the I/O leads 130 of the BGA package 100, or a selected portion thereof, may be characterized in a similar manner.

The test signal or signals provided by the network analyzer 20 via the signal conductor 31 of the coaxial test probe 30 may comprise a frequency sweep in which signals increasing in frequency between a selected start frequency and a selected end frequency are provided to the electrical lead 130a. The network analyzer 20 may, therefore, provide an indication of the parasitic inductance at various frequencies between the start and end frequencies. A typical frequency sweep may comprise, for example, a 401 point sweep providing data at 401 discrete frequency points between, and including, the start and end frequencies.

It is not necessary that every electrical lead 130 of the conventional BGA package 100 be electrically connected to the central conductive plane 150a, 150b, so long as all of the I/O leads 130 to be characterized are electrically connected thereto. For example, the $V_{CC}$, $V_{SS}$, or $V_{REF}$ leads would not need to be electrically connected to the central conductive plane 150a, 150b. Further, the parasitic inductance of an I/O lead 130 may be measured directly between the ball lead 132 of that I/O lead 130 and the central conductive plane 150a, 150b by electrically connecting the ground conductor 32 of the coaxial test probe 30 to the central conductive plane 150a, 150b, in which case the parasitic inductance of only that I/O lead 130 is measured. However, electrically connecting the ground conductor 32 of the coaxial test probe 30 to the central conductive plane 150a, 150b may require either a large pitch (i.e., the distance between the signal and ground conductors 31, 32) coaxial test probe 30 or a wire or other conductor extending between the ground conductor 32 and the central conductive plane 150a, 150b. A large pitch probe or a conductor extending from the ground conductor 32 of the coaxial test probe 30 to the central conductive plane 150a, 150b may each itself exhibit a parasitic inductance that could effect the measured parasitic inductance of an I/O lead 130.

Therefore, as a matter of convenience, all of the electrical leads 130 of the conventional BGA package 100 may be electrically connected to the central conductive plane 150a, 150b, such that every I/O lead 130 to be characterized will have a ball lead 132 lying adjacent to a ball lead 132 of another electrical lead 130 electrically connected to the central conductive plane 150a, 150b, thereby enabling the smallest possible pitch coaxial test probe 30 (i.e., one having a pitch substantially the same as the distance between any two ball leads 132) to be used and eliminating the need to extend a conductor from the ground conductor 32 of the coaxial test probe 30 to the central conductive plane 150a, 150b.

Figure 15:
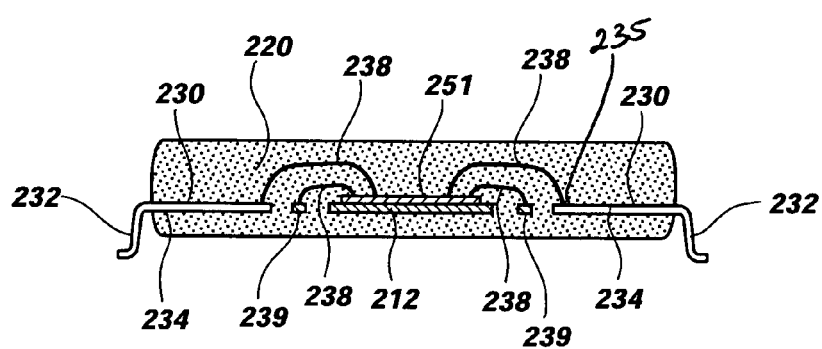
FIG. 15 shows a portion of the conventional TSOP having a central conductive plane according to the present invention for measuring parasitic inductance.

To measure the parasitic inductance of an electrical lead 230 of the conventional TSOP 200, the semiconductor die 210 is removed from the TSOP 200 (or a "dummy" TSOP is constructed without a semiconductor die 210) and all of the electrical leads 230 of the TSOP 200 are electrically connected to a central conductive plane. Referring to FIG. 15, the central conductive plane 251 may, for example, be formed directly on the die-attach pad 212. A bond wire 238 may be used electrically to connect the bond end 235 of each electrical lead 230 to the central conductive plane 251. One or more bond wires 238 may also electrically connect the bus bar or bars 239 to the central conductive plane 251. In another embodiment, an encapsulant material 220 may encapsulate the central conductive plane 251 and at least a portion of each electrical lead 230, as shown in FIG. 15.

The central conductive plane 251 may be constructed of any suitable conductive material and according to any suitable methods known in the art. For example, the central conductive plane 251 may, for example, comprise an alumina substrate formed on the die-attach pad 212 or a layer of conductive epoxy adhered to the die-attach pad 212. Although shown in FIG. 15 as a generally planar structure, the central conductive plane 251 may be of any suitable shape or configuration, so long as the central conductive plane 251 provides a point at which continuity may be established between the electrical leads 230 of the TSOP 200.

A coaxial test probe 30 is electrically connected to the first port 21 (or, optionally, the second port 22) of a network analyzer 20. The network analyzer 20 and coaxial test probe 30 are calibrated to the tip of the coaxial test probe 30, such that the parasitic inductances of the network analyzer 20 and coaxial test probe 30 are removed from the measured data, as noted above. The network analyzer 20 is then configured to operate in the $S_{11}$ mode (or, optionally, the $S_{22}$ mode), such that electrical test signal or signals are sent from the first port 21 of the network analyzer 20 and the reflected signal or signals are received at the first port 21, also as noted above.

The coaxial test probe 30 is then contacted against the external portion 232 of the electrical lead 230 to be characterized and the external portion 232 of another adjacent electrical lead 230 that is electrically connected to the central conductive plane 251. The signal conductor 31 (shown in FIGS. 11 and 12) is contacted against the external portion 232 of the electrical lead 230 to be characterized to establish electrical communication therebetween and, similarly, the ground conductor 32 (shown in FIGS. 11 and 12) is contacted against the external portion 232 of the adjacent electrical lead 230 to establish electrical contact therebetween. A circuit is thus formed between the external portion 232 of the electrical lead 230 being characterized and the external portion 232 of the other adjacent electrical lead 230 having an inductance therebetween comprising the individual parasitic inductance of the electrical lead 230 to be characterized and the individual parasitic inductance of the other adjacent electrical lead 230, which are in series.

To measure the parasitic inductance of the electrical lead 230 being characterized, a test signal or signals are sent via the signal conductor 31 of the coaxial test probe 30 to that electrical lead 230. The signal or signals reflected from the TSOP 200 through the electrical lead 230 being characterized will then be received by the coaxial test probe 30 and provided to the network analyzer 20. As noted above, the reflected signal or signals from the TSOP 200 can be directly related to the impedance of the electrical lead 230 being characterized. The network analyzer 20 is configured to equate the reflected signal or signals to an impedance measurement such that the parasitic inductance can be determined. However, because the parasitic inductance of the electrical lead 230 being characterized is added in series to the parasitic inductance of the other adjacent electrical lead 230, the measured parasitic inductance is divided by two to obtain the individual parasitic inductance of the electrical lead 230 being characterized. This result assumes, of course, that the parasitic inductances of the electrical lead 230 being characterized and the other adjacent electrical lead 230 are approximately equal. This assumption will introduce some error into the measured data due to differences in length, thickness, and width of the electrical lead 230 being characterized and any adjacent electrical leads 230; however, it is believed that, for the purpose of package characterization during the design process, such errors will not be significant, as was noted above. All of the I/O leads 230 of the TSOP 200, or a selected portion thereof, may be characterized in a similar manner.

The test signal or signals provided by the network analyzer 20 via the signal conductor 31 of the coaxial test probe 30 may comprise a frequency sweep in which signals increasing in frequency between a selected start frequency and a selected end frequency are provided to the electrical lead 230 being characterized. The network analyzer 20, may, therefore, provide an indication of the parasitic inductance at various frequencies between the start and end frequencies, as noted above.

It is not necessary that every electrical lead 230 of the conventional TSOP 200 be electrically connected to the central conductive plane 251, so long as all of the I/O leads 230 to be characterized are electrically connected thereto. For example, the $V_{CC}$, $V_{SS}$, or $V_{REF}$ leads would not need to be electrically connected to the central conductive plane 251. Further, the parasitic inductance of an electrical lead 230 may be measured directly between the external portion 232 of that electrical lead 230 and the central conductive plane 251 by electrically connecting the ground conductor 32 of the coaxial test probe 30 to the central conductive plane 251, in which case the parasitic inductance of only that electrical lead 230 is measured. However, electrically connecting the ground conductor 32 of the coaxial test probe 30 to the central conductive plane 251 may require either a large pitch coaxial test probe 30 or a wire or other conductor extending between the ground conductor 32 and the central conductive plane 251. A large pitch probe or a conductor extending from the ground conductor 32 of the coaxial test probe 30 to the central conductive plane 251 may each itself exhibit a parasitic inductance that could effect the measured parasitic inductance of an electrical lead 230.

Therefore, as a matter of convenience, all of the electrical leads 230 of the conventional TSOP 200 may be electrically connected to the central conductive plane 251, such that every electrical lead 230 to be characterized will have an external portion 232 lying adjacent to the external portion 232 of another electrical lead 230 that is electrically connected to the central conductive plane 251, thereby enabling the smallest possible pitch coaxial test probe 30 (i.e., one having a pitch substantially the same as the distance between any two external portions 232 of two adjacent electrical leads 230) to be used and eliminating the need to extend a conductor from the ground conductor 32 of the coaxial test probe 30 to the central conductive plane 251.

Figure 17:
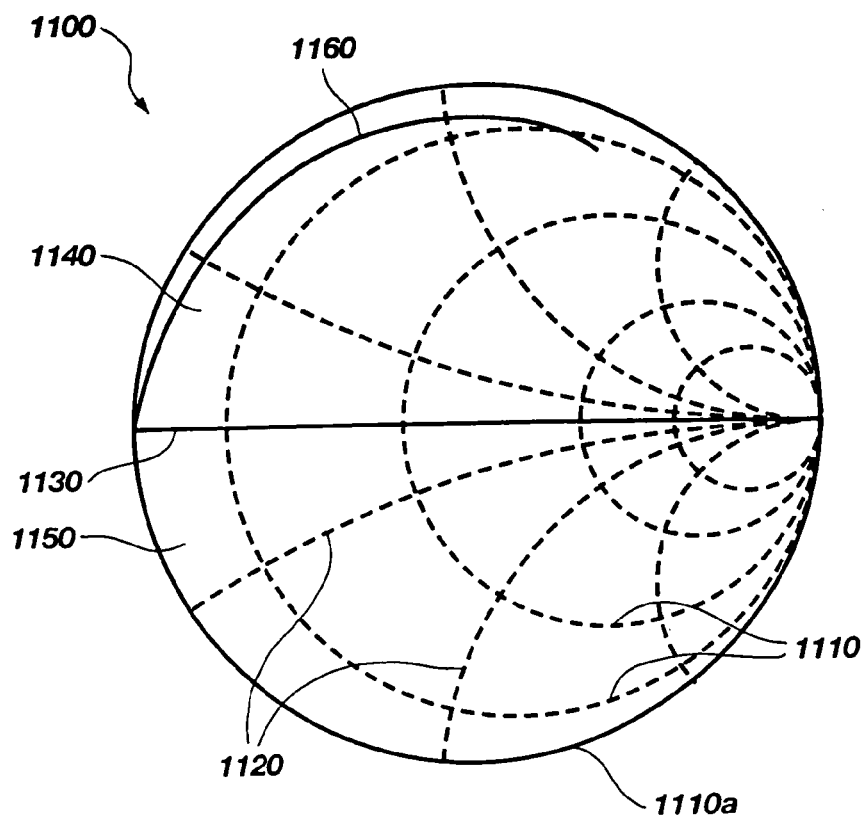
FIG. 17 shows parasitic inductance data for an integrated circuit package presented in a Smith chart format.

Referring to FIG. 17, exemplary data for the parasitic inductance of an I/O lead of an integrated circuit package is shown. The data is presented in a Smith chart 1100 format, which may be provided directly by the network analyzer 20, as noted above. The Smith chart 1100 includes mutually orthogonal lines of constant resistance 1110 and lines of constant reactance 1120, which may be either capacitive or inductive. The outermost line of constant resistance 1110a corresponds to a resistance of zero. In the portion 1140 above the central axis 1130 of the Smith chart 1100 the reactance is inductive, and in the portion 1150 below the central axis 1130 the reactance is capacitive. A generally smooth curve 1160 depicts the parasitic inductance for an I/O lead of an integrated circuit package measured according to the present invention. The smooth curve 1160 represents a best-fit curve connecting a selected number of individual parasitic inductance data points measured at selected, discrete frequencies.

For measuring parasitic capacitance and for measuring parasitic inductance according to the invention, irrespective of the integrated circuit package configuration, electrical signal or signals are provided to the I/O lead being characterized (and, for inductance measurements, to one adjacent electrical lead) by a network analyzer 20 via the signal conductor 31 of a coaxial test probe 30. However, during actual operation of an integrated circuit package, such as the conventional BGA package 100 or the conventional TSOP 200, all of the electrical leads in proximity to the I/O lead of interest, as well as the semiconductor die 110, may have electrical signals propagating therethrough. Although the apparatus and methods of the present invention may not simulate such an operational environment, it is believed that the parasitic capacitance and inductance measured according to the invention for any individual I/O lead provide an indication of the potential for mutual coupling of that I/O lead with other adjacent electrical leads and other components of the integrated circuit package. Thus, characterization of all of the I/O leads of an integrated circuit package using apparatus and methods according to the present invention provides an indication of the signal integrity provided by an integrated circuit package or a proposed package design.

Apparatus and methods for measuring mutual coupling in an integrated circuit package according to the present invention having been herein described, those of ordinary skill in the art will appreciate the many advantages of the present invention. The apparatus and methods of the present invention provide an integrated circuit package designer with a simple, low-cost, and relatively quick method of measuring the parasitic capacitances and inductances of the I/O leads of an integrated circuit package using a commercially available network analyzer and coaxial probe. The parasitic capacitances and inductances measured according to the invention may provide a package designer with an indication of the susceptibility of a proposed package design to mutual coupling between I/O leads and between an I/O lead and other components of the integrated circuit package. Further, parasitic capacitances and inductances measured according to the invention provide the package designer with a tool for validating design models.

Parasitic capacitance of an I/O lead of a conventional BGA package 100 may be measured according to a simple test method with minimal fixturing, which may include connecting a wire or bus bar 170 across a column 152, 162 of ball leads 132. A simple test method in conjunction with a non-complex, low-cost test substrate 300, which may be constructed from printed circuit board materials according to well known PCB fabrication techniques, may be used to measure parasitic capacitance of an I/O lead of a conventional TSOP 200 or other similar package types having lead frame construction. The parasitic capacitance of an integrated circuit package may be measured without the semiconductor die 110 by removing the semiconductor die 110 from the package or, alternatively, by constructing a "dummy" package without a semiconductor die 110.

Parasitic inductance of an I/O lead of either a conventional BGA package 100 or TSOP 200, as well as other known package configurations, may be measured using a simple test method with minimal test setup. Test setup may include removing the semiconductor die 110 from an integrated circuit package or, alternatively, constructing a "dummy" package having no semiconductor die 110 and forming a central conductive plane 150a, 150b, 251 in the integrated circuit package configured to provide continuity between all of the electrical leads of the package.

The foregoing detailed description and accompanying drawings are only illustrative and are not restrictive. They have been provided primarily for a clear and comprehensive understanding of the present invention and no unnecessary limitations are to be understood therefrom. Numerous additions, deletions, and modifications to the embodiments of the present invention, as well as alternative arrangements, may be devised by those skilled in the art without departing from the spirit of the present invention and the scope of the appended claims.

What is claimed is:

1. A method of characterizing an electrical component, the electrical component comprising a die-attach pad and a plurality of leads extending outwardly from the die-attach pad, each lead of the plurality of leads comprising a conductor having a bond end located proximate the die-attach pad and an opposing end, the method comprising:

electrically contacting at least one lead of the plurality of leads to a ground plane provided by a test substrate;

maintaining at least one other lead of the plurality of leads in a position so as to prevent contact between the at least one other lead of the plurality of leads and any surface of the test substrate;

configuring at least the at least one other lead of the plurality of leads so as to be electrically open;

contacting a signal conductor of a coaxial probe against the opposing end of the conductor of the at least one other lead of the plurality of leads of the electrical component, the coaxial probe in electrical communication with one port of a network analyzer;

contacting a ground conductor of the coaxial probe against the ground plane of the test substrate;

forcing the ground plane of the test substrate to a ground potential provided by the network analyzer;

sending at least one test signal from the network analyzer and through the signal conductor of the coaxial probe to the at least one other lead of the plurality of leads; and directly measuring at least one reflected signal from the electrical component with the network analyzer and indicating a parasitic capacitance of the at least one other lead of the plurality of leads with the network analyzer.

2. The method of claim 1, wherein the electrical component further includes a semiconductor die secured to a surface of the die-attach pad and another lead of the plurality of leads is configured to provide power to the semiconductor die, the method further comprising:

electrically isolating the another lead of the plurality of leads from the ground plane of the test substrate;

applying a voltage to the another lead of the plurality of leads to power the semiconductor die; and directly measuring the at least one reflected signal from the electrical component with the network analyzer and indicating the parasitic capacitance of the at least one other lead of the plurality of leads with the network analyzer when the voltage has been applied to the semiconductor die.

3. The method of claim 1, further comprising:

sending at least one test signal of a first frequency from the network analyzer and through the signal conductor of the coaxial probe to the at least one other lead of the plurality of leads;

directly measuring the at least one first reflected signal from the electrical component with the network analyzer and indicating the first parasitic capacitance of the at least one other lead of the plurality of leads with the network analyzer;

sending at least one test signal of at least a second frequency from the network analyzer and through the signal conductor of the coaxial probe to the at least one other lead of the plurality of leads; and directly measuring at least one second reflected signal from the electrical component with the network analyzer and indicating a second parasitic capacitance of the at least one other lead of the plurality of leads with the network analyzer.

4. A method of characterizing an electrical component, the electrical component comprising a die-attach pad and a plurality of leads extending outwardly from the die-attach pad, each lead of the plurality of leads comprising a conductor having a bond end located proximate the die-attach pad and an opposing end, the method comprising:

electrically contacting at least one lead of the plurality of leads to a ground plane provided by a test substrate;

contacting at least one other lead of the plurality of leads against a surface of the test substrate and electrically isolating the at least one other lead of the plurality of leads from the ground plane of the test substrate;

configuring at least the at least one other lead of the plurality of leads so as to be electrically open;

contacting a signal conductor of a coaxial probe against the opposing end of the conductor of the at least one other lead of the plurality of leads, the coaxial probe in electrical communication with one port of a network analyzer;

contacting a ground conductor of the coaxial probe against the ground plane of the test substrate;

forcing the ground plane of the test substrate to a ground potential provided by the network analyzer;

sending at least one test signal from the network analyzer and through the signal conductor of the coaxial probe to the at least one other lead of the plurality of leads; and directly measuring at least one reflected signal from the electrical component with the network analyzer and indicating a parasitic capacitance of the at least one other lead of the plurality of leads with the network analyzer.

5. A method of characterizing a BGA component, the BGA component comprising a substrate and a plurality of leads formed on the substrate, each lead of the plurality of leads at least including a conductive trace formed on an upper surface of the substrate, a conductive via extending through the substrate and having one end electrically connected to the conductive trace, and a ball lead formed on an opposing surface of the substrate and in electrical communication with an opposing end of the conductive via, the method comprising:

providing a central conductive plane on at least a portion of the upper surface of the substrate of the BGA component;

electrically connecting the conductive trace of at least one lead of the plurality of leads to the central conductive plane;

electrically connecting the conductive trace of at least one other lead of the plurality of leads to the central conductive plane, the at least one other lead having a ball lead located on the opposing surface of the substrate at a position adjacent a ball lead of the at least one lead of the plurality of leads;

contacting a signal conductor of a coaxial probe against the ball lead of the at least one lead of the plurality of leads, the coaxial probe in electrical communication with one port of a network analyzer;

contacting a ground conductor of the coaxial probe against the adjacent ball lead of the at least one other lead of the plurality of leads;

sending at least one test signal from the network analyzer and through the signal conductor of the coaxial probe to the at least one lead of the plurality of leads; and directly measuring at least one reflected signal from the BGA component with the network analyzer and indicating a parasitic inductance of the at least one lead of the plurality of leads with the network analyzer.

6. The method of claim 5, further comprising dividing the indicated parasitic inductance by two to obtain a corrected value of parasitic inductance.

7. The method of claim 5, further comprising:
sending at least one test signal of a first frequency from the network analyzer and through the signal conductor of the coaxial probe to the at least one lead of the plurality of leads;
directly measuring at least one first reflected signal from the BGA component with the network analyzer and indicating a first parasitic inductance of the at least one lead of the plurality of leads with the network analyzer;
sending at least one test signal of at least a second frequency from the network analyzer and through the signal conductor of the coaxial probe to the at least one lead of the plurality of leads; and
directly measuring at least one second reflected signal from the BGA component with the network analyzer and indicating a second parasitic inductance of the at least one lead of the plurality of leads with the network analyzer.

8. A method of characterizing a BGA component comprising:
providing a BGA component including a substrate and a plurality of leads formed on the substrate, each lead of the plurality of leads at least including a conductive trace formed on an upper surface of the substrate, a conductive via extending through the substrate and having one end electrically connected to the conductive trace, and a ball lead formed on an opposing surface of the substrate and in electrical communication with an opposing end of the conductive via;
configuring each lead of the plurality of leads so as to be electrically open;
contacting a signal conductor of a coaxial probe against a ball lead of one lead of the plurality of leads, the coaxial probe in electrical communication with one port of a network analyzer;
contacting a ground conductor of the coaxial probe against an adjacent ball lead of another lead of the plurality of leads;
forcing the another lead of the plurality of leads to a ground potential provided by the network analyzer;
sending at least one test signal from the network analyzer and through the signal conductor of the coaxial probe to the one lead of the plurality of leads; and
directly measuring at least one reflected signal from the BGA component with the network analyzer and indicating a parasitic capacitance of the one lead of the plurality of leads with the network analyzer.

9. The method of claim 8, wherein the ball lead of the another lead of the plurality of leads is located in a row of ball leads of other leads of the plurality of leads, the method further comprising:
electrically connecting the ball lead of the another lead of the plurality of leads to all other ball leads in the row; and
forcing the another lead of the plurality of leads and the other leads of the plurality of leads having ball leads in the row to the ground potential provided by the network analyzer.

10. The method of claim 8, wherein the BGA component further includes a semiconductor die secured to the upper surface of the substrate and at least one lead of the plurality of leads is configured to provide power to the semiconductor die, the method further comprising:
applying a voltage to the at least one lead of the plurality of leads to power the semiconductor die; and
directly measuring the at least one reflected signal from the BGA component with the network analyzer and indicating a parasitic capacitance of the at least one lead of the plurality of leads with the network analyzer when the voltage has been applied to the semiconductor die.

11. The method of claim 10, further comprising:
sending at least one test signal of a first frequency from the network analyzer and through the signal conductor of the coaxial test probe to the one lead of the plurality of leads;
directly measuring the at least one first reflected signal from the BGA component with the network analyzer and indicating a first parasitic capacitance of the one lead of the plurality of leads with the network analyzer;
sending at least one test signal of at least a second frequency from the network analyzer and through the signal conductor of the coaxial probe to the one lead of the plurality of leads; and
directly measuring at least one second reflected signal from the BGA component with the network analyzer and indicating a second parasitic capacitance of the one lead of the plurality of leads with the network analyzer.

12. A method of characterizing an electrical component comprising:
providing an electrical component including a die-attach pad and a plurality of leads extending outwardly from the die-attach pad, each lead of the plurality of leads comprising a conductor having a bond end located proximate the die-attach pad and an opposing end;
electrically contacting at least one lead of the plurality of leads to a ground plane provided by a test substrate;
maintaining at least one other lead of the plurality of leads in a position so as to prevent contact between the at least one other lead of the plurality of leads and any surface of the test substrate;
configuring at least the at least one other lead of the plurality of leads so as to be electrically open;
contacting a signal conductor of a coaxial probe against the opposing end of the conductor of the at least one other lead of the plurality of leads of the electrical component, the coaxial probe in electrical communication with one port of a network analyzer;
contacting a ground conductor of the coaxial probe against the ground plane of the test substrate;
forcing the ground plane of the test substrate to a ground potential provided by the network analyzer;
sending at least one test signal from the network analyzer and through the signal conductor of the coaxial probe to the at least one other lead of the plurality of leads; and
directly measuring at least one reflected signal from the electrical component with the network analyzer and indicating a parasitic capacitance of the at least one other lead of the plurality of leads with the network analyzer.

13. The method of claim 12, wherein the electrical component further includes a semiconductor die secured to a surface of the die-attach pad and another lead of the plurality of leads is configured to provide power to the semiconductor die, the method further comprising:
electrically isolating the another lead of the plurality of leads from the ground plane of the test substrate;
applying a voltage to the another lead of the plurality of leads to power the semiconductor die; and
directly measuring the at least one reflected signal from the electrical component with the network analyzer and indicating the parasitic capacitance of the at least one other lead of the plurality of leads with the network analyzer when the voltage has been applied to the semiconductor die.

14. The method of claim 12, further comprising:

sending at least one test signal of a first frequency from the network analyzer and through the signal conductor of the coaxial probe to the at least one other lead of the plurality of leads;

directly measuring at least one first reflected signal from the electrical component with the network analyzer and indicating a first parasitic capacitance of the at least one other lead of the plurality of leads with the network analyzer;

sending at least one test signal of at least a second frequency from the network analyzer and through the signal conductor of the coaxial probe to the at least one other lead of the plurality of leads; and directly measuring at least one second reflected signal from the electrical component with the network analyzer and indicating a second parasitic capacitance of the at least one other lead of the plurality of leads with the network analyzer.

15. A method of characterizing an electrical component comprising:

providing an electrical component including a die-attach pad and a plurality of leads extending outwardly from the die-attach pad, each lead of the plurality of leads comprising a conductor having a bond end located proximate the die-attach pad and an opposing end;

electrically contacting at least one lead of the plurality of leads to a ground plane provided by a test substrate;

contacting at least one other lead of the plurality of leads against a surface of the test substrate and electrically isolating the at least one other lead of the plurality of leads from the ground plane of the test substrate;

configuring at least the at least one other lead of the plurality of leads so as to be electrically open;

contacting a signal conductor of a coaxial probe against the opposing end of the at least one other lead of the plurality of leads, the coaxial probe in electrical communication with one port of a network analyzer;

contacting a ground conductor of the coaxial probe against the ground plane of the test substrate;

forcing the ground plane of the test substrate to a ground potential provided by the network analyzer;

sending at least one test signal from the network analyzer and through the signal conductor of the coaxial probe to the at least one other lead of the plurality of leads; and directly measuring at least one reflected signal from the electrical component with the network analyzer and indicating a parasitic capacitance of the at least one other lead of the plurality of leads with the network analyzer.

16. A method of characterizing a BGA component comprising:

providing a BGA component including a substrate and a plurality of leads formed on the substrate, each lead of the plurality of leads at least including a conductive trace formed on an upper surface of the substrate, a conductive via extending through the substrate and having one end electrically connected to the conductive trace, and a ball lead formed on an opposing surface of the substrate and in electrical communication with an opposing end of the conductive via;

providing a central conductive plane on at least a portion of the upper surface of the substrate of the BGA component;

electrically connecting the conductive trace of at least one lead of the plurality of leads to the central conductive plane;

electrically connecting the conductive trace of at least one other lead of the plurality of leads to the central conductive plane, the at least one other lead having a ball lead located on the opposing surface of the substrate at a position adjacent a ball lead of the at least one lead of the plurality of leads;

contacting a signal conductor of a coaxial probe against the ball lead of the at least one lead of the plurality of leads, the coaxial probe in electrical communication with one port of a network analyzer;

contacting a ground conductor of the coaxial probe against the adjacent ball lead of the at least one other lead of the plurality of leads;

sending at least one test signal from the network analyzer and through the signal conductor of the coaxial probe to the at least one lead of the plurality of leads; and directly measuring at least one reflected signal from the BGA component with the network analyzer and indicating a parasitic inductance of the at least one lead of the plurality of leads with the network analyzer.

17. The method of claim 16, further comprising dividing the indicated parasitic inductance by two to obtain a corrected value of parasitic inductance.

18. The method of claim 16, further comprising:

sending at least one test signal of a first frequency from the network analyzer and through the signal conductor of the coaxial probe to the at least one lead of the plurality of leads;

directly measuring at least one first reflected signal from the BGA component with the network analyzer and indicating a first parasitic inductance of the at least one lead of the plurality of leads with the network analyzer;

sending at least one test signal of at least a second frequency from the network analyzer and through the signal conductor of the coaxial probe to the at least one lead of the plurality of leads; and directly measuring at least one second reflected signal from the BGA component with the network analyzer and indicating a second parasitic inductance of the at least one lead of the plurality of leads with the network analyzer.

* * * * *